(12) United States Patent
Kim

(10) Patent No.: US 9,607,700 B2
(45) Date of Patent: Mar. 28, 2017

(54) NON-VOLATILE MEMORY DEVICE, MEMORY SYSTEM, AND METHODS OF OPERATING THE DEVICE AND SYSTEM

(71) Applicant: Seung-Bum Kim, Hwaseong-si (KR)

(72) Inventor: Seung-Bum Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/065,906

(22) Filed: Mar. 10, 2016

(65) Prior Publication Data

US 2016/0322109 A1 Nov. 3, 2016

(30) Foreign Application Priority Data

Apr. 28, 2015 (KR) ........................ 10-2015-0060086

(51) Int. Cl.
G11C 16/04 (2006.01)
G11C 16/10 (2006.01)
G11C 16/34 (2006.01)

(52) U.S. Cl.
CPC .......... *G11C 16/10* (2013.01); *G11C 16/3454* (2013.01)

(58) Field of Classification Search
None
See application file for complete search history.

(56) References Cited

U.S. PATENT DOCUMENTS

| | | | |
|---|---|---|---|
| 7,206,230 B2 | 4/2007 | Li et al. | |
| 7,447,078 B2 | 11/2008 | Li | |
| 7,457,157 B2 | 11/2008 | Kim | |
| 7,480,181 B2 | 1/2009 | Li | |
| 7,493,447 B2 | 2/2009 | Chuang | |
| 7,502,260 B2 | 3/2009 | Li | |
| 7,505,320 B2 | 3/2009 | Li | |
| 7,577,029 B2 | 8/2009 | Pyeon | |
| 7,577,037 B2 | 8/2009 | Li et al. | |
| 7,782,680 B2 | 8/2010 | Jung et al. | |
| 7,924,628 B2 | 4/2011 | Danon et al. | |
| 7,936,602 B2 | 5/2011 | Li et al. | |
| 8,351,269 B2 | 1/2013 | Li | |
| 2008/0080260 A1* | 4/2008 | Seong ................. G11C 7/1048 365/189.05 |
| 2008/0175048 A1* | 7/2008 | Kang ................. G11C 11/5628 365/185.03 |
| 2010/0058003 A1 | 3/2010 | Goto et al. | |
| 2012/0203959 A1* | 8/2012 | Yoon .................. G06F 12/0246 711/103 |
| 2013/0007349 A1 | 1/2013 | D'Abreu et al. | |
| 2014/0036588 A1 | 2/2014 | Crippa et al. | |
| 2014/0304459 A1 | 10/2014 | Kim et al. | |
| 2014/0344505 A1 | 11/2014 | Lim | |
| 2015/0003156 A1 | 1/2015 | Berckmann et al. | |

FOREIGN PATENT DOCUMENTS

KR 10-098431 12/2011

* cited by examiner

*Primary Examiner* — Son Dinh
*Assistant Examiner* — Uyen B Tran
(74) *Attorney, Agent, or Firm* — Volentine & Whitt, PLLC

(57) ABSTRACT

The method of operating a non-volatile memory device includes dumping data stored in input latches of a page buffer to other latches of the page buffer to receive second data to be written to a second cell group of a memory cell array from outside the non-volatile memory device during writing of first data to a first cell group of the memory cell array. In the method, receiving of the second data may be finished before the writing of the first data is finished.

20 Claims, 26 Drawing Sheets

NON-VOLATILE MEMORY DEVICE, MEMORY SYSTEM, AND METHODS OF OPERATING THE DEVICE AND SYSTEM

CROSS-REFERENCE TO RELATED APPLICATION

This application claims the benefit of Korean Patent Application No. 10-2015-0060086, filed on Apr. 28, 2015, in the Korean Intellectual Property Office, the disclosure of which is incorporated herein in its entirety by reference.

BACKGROUND

The inventive concept relates to a memory device, and more particularly, to a non-volatile memory device, a memory system including the non-volatile memory device, a method of operating the non-volatile memory device, and a method of operating the memory system.

Memory devices used to store data may be categorized as either volatile memory devices or non-volatile memory devices. As an example of a non-volatile memory device, a flash memory device may be used for portable phones, digital cameras, portable digital assistants (PDAs), mobile computer devices, fixed computer devices, and other devices.

SUMMARY

The inventive concept provides a non-volatile memory device capable of improving operating performance, a memory system including a non-volatile memory device, a method of operating a non-volatile memory device, and a method of operating a memory system.

According to an aspect of the inventive concept, there is provided a method of operating a non-volatile memory device. When each of m and n is an integer equal to or greater than 2, the non-volatile memory device includes a memory cell array including a plurality of memory cells vertically stacked on a substrate and configured to respectively store n-bit data, and a page buffer configured to write data in parallel in m memory cells of the plurality of memory cells. The page buffer includes m latch modules, each of which includes n latches including an input latch.

According to an exemplary embodiment, the method of operating the non-volatile memory device includes applying at least one pulse to a first cell group of the memory cell array to write first data stored in the m latch modules to the first cell group, releasing m input latches of the m latch modules based on states of memory cells of the first cell group, which are changed according to the at least one pulse, and transmitting second data to be written to a second cell group of the memory cell array in units of m-bit data to the m input latches. The releasing of the m input latches may include dumping data stored in the input latch of each of the m latch modules to another latch of the n latches.

According to an exemplary embodiment, a method of operating a non-volatile memory system is provided. The non-volatile memory system includes a memory controller and the above-described non-volatile memory device. The method includes applying at least one pulse to a first cell group of the memory cell array to write first data stored in the m latch modules to the first cell group in the non-volatile memory device, releasing m input latches of the m latch modules based on states of memory cells of the first cell group, which are changed according to the at least one pulse in the non-volatile memory device, outputting a release signal from the non-volatile memory device to the memory controller, and transmitting m-bit data of second data to be written to a second cell group of the memory cell array to the non-volatile memory device in response to the release signal in the memory controller. The releasing of the m input latches and the transmitting of the m-bit data of the second data are performed at least twice during the writing of the first data in the first cell group.

According to another aspect of the inventive concept, there is provided a method of operating a non-volatile memory device. When each of m and n is an integer equal to or greater than 2, the non-volatile memory device includes a memory cell array including a plurality of memory cells vertically stacked on a substrate, each memory cell configured to store n-bit data, and a latch module configured to write data to one of the plurality of memory cells. Herein, the latch module includes n latches including an input latch.

According to an exemplary embodiment, the method of operating the non-volatile memory device includes applying at least one pulse to a first memory cell to write n-bit first cell data stored in the latch module to a first memory cell of the memory cell array, releasing the input latch based on a state of the first memory cell that is changed according to the at least one pulse, and transmitting second cell data to be written to a second memory cell of the memory cell array, in units of 1-bit data, to the released input latch. The releasing of the input latch includes dumping data stored in the input latch to another latch of the n latches.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
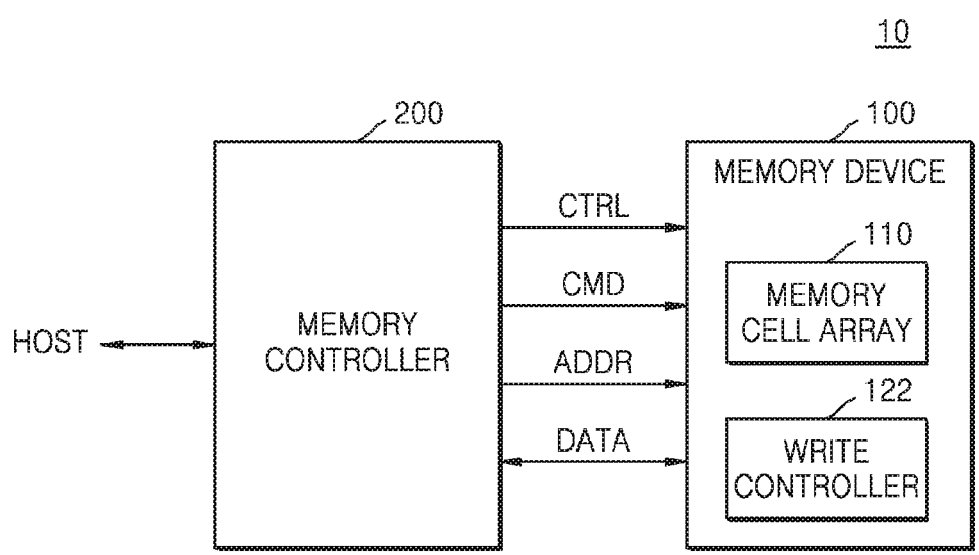
FIG. 1 is a schematic block diagram of a memory system according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which exemplary embodiments of the inventive concept are shown. These exemplary embodiments are provided so that this disclosure is thorough and complete and fully conveys the scope of the inventive concept to one of ordinary skill in the art. Accordingly, while the inventive concept can be modified in various ways and take on various alternative forms, specific exemplary embodiments thereof are shown in the drawings and described in detail below as examples. There is no intent to limit the inventive concept to the particular forms disclosed. On the contrary, the inventive concept is to cover all modifications, equivalents, and alternatives falling within the spirit and scope of the appended claims. Like reference numerals refer to like elements throughout. In the drawings, the thicknesses of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element and, similarly, a second element could be termed a first element, without departing from the scope of the present invention.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

FIG. 1 is a schematic block diagram of a memory system 10 according to an exemplary embodiment. Referring to FIG. 1, the memory system 10 may include a memory device 100 and a memory controller 200. The memory device 100 may include a memory cell array 110 and a write controller 122.

The memory cell array 110 may include a plurality of memory cells (not shown). According to an exemplary embodiment, the memory cell array 110 may be a three-dimensional (3D) memory array. The 3D memory array is monolithically formed in one or more physical levels of arrays of memory cells having an active area provided above a silicon substrate and circuitry associated with the operation of those memory cells, wherein such associated circuitry may be above or within such a substrate. The term "monolithic" means that layers of each level of the array are directly deposited on the layers of each underlying level of the array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
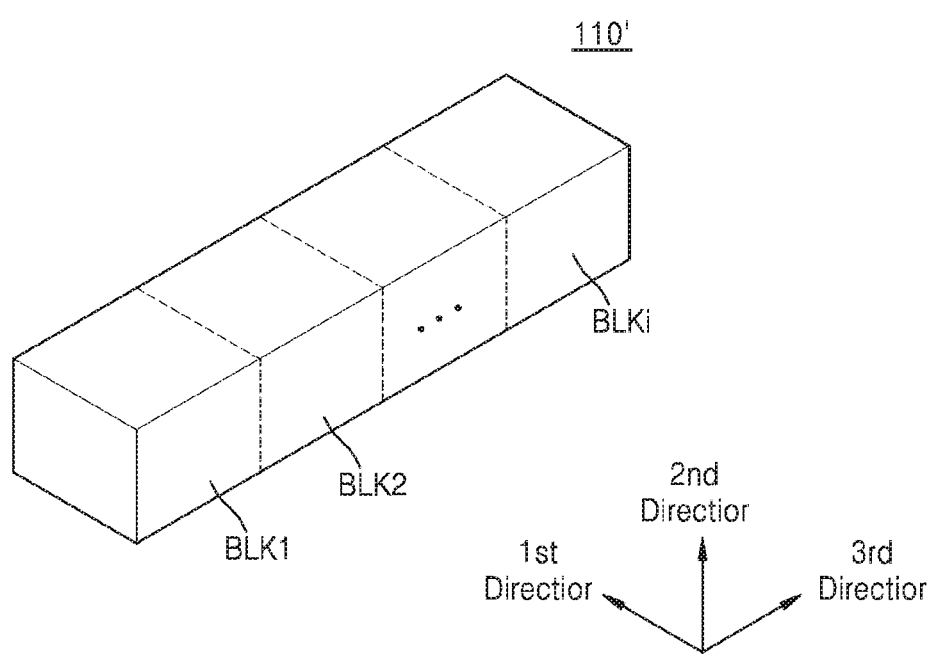
FIG. 3 illustrates an example of a memory cell array included in the memory device of FIG. 2.
Figure 4:
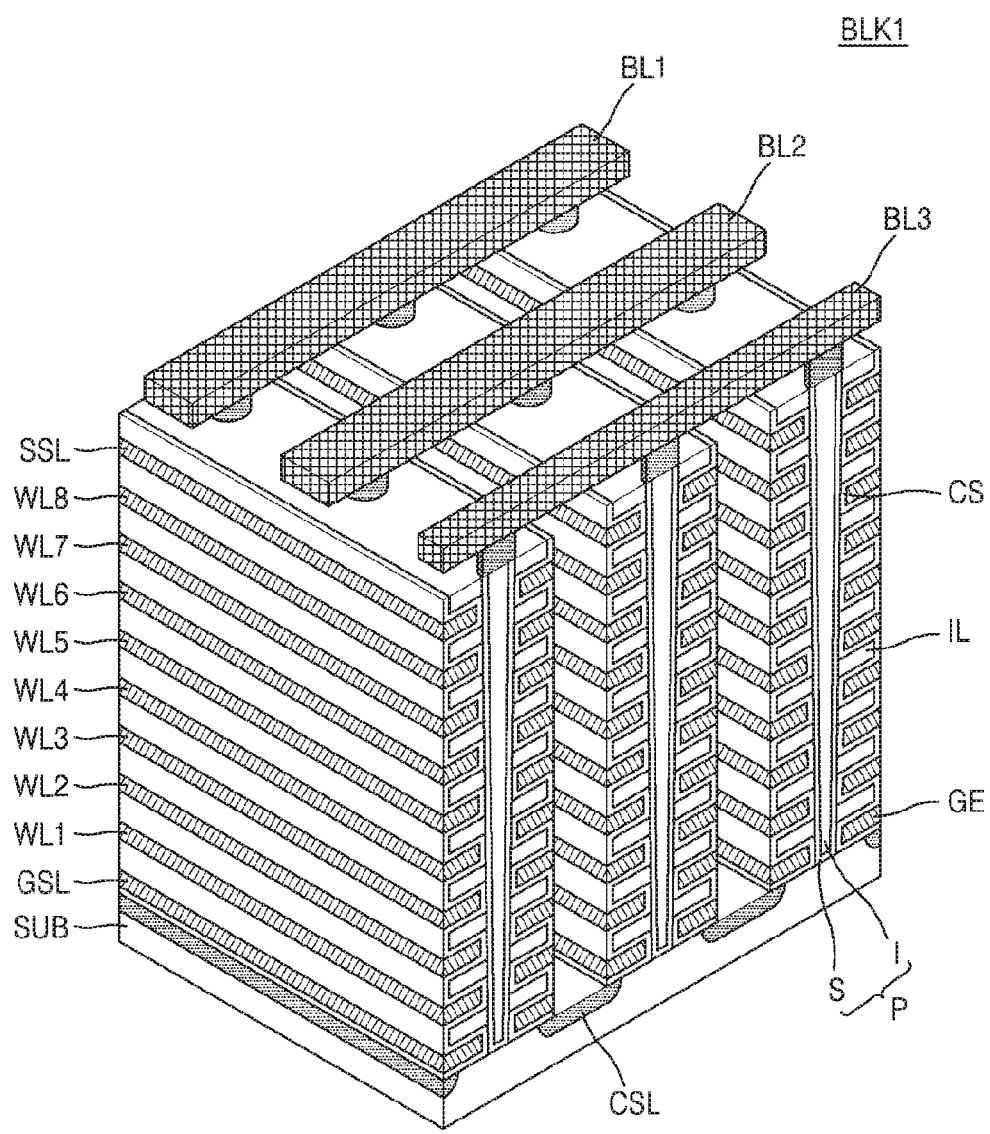
FIG. 4 is a perspective view of an example of a first memory block, which is one of a plurality of memory blocks of FIG. 3.

According to an exemplary embodiment, a 3D memory array may include vertical NAND strings arranged in a vertical direction such that at least one memory cell is arranged on another memory cell, and at least one memory cell may include a charge trap layer (refer to FIGS. 3 and 4). That is, the plurality of memory cells may be 3D vertical NAND (VNAND) flash memory cells. Hereinafter, exemplary embodiments will be described in detail under the assumption that the plurality of memory cells of the memory cell array 110 are NAND flash memory cells. In other exemplary embodiments, the plurality of memory cells may be 2D planar NAND flash memory cells. However, the inventive concept is not limited thereto. In another exemplary embodiment, the plurality of memory cells may be resistive memory cells of resistive RAM (RRAM), phase-change RAM (PRAM), or magnetic RAM (MRAM).

In an exemplary embodiment, each of the memory cells included in the memory cell array 110 may store 2-bit data or more. In an exemplary embodiment, each of the memory cells included in the memory cell array 110 may be a multi-level cell (MLC) configured to store 2-bit data. In another exemplary embodiment, each of the memory cells included in the memory cell array 110 may be a triple-level cell (TLC) configured to store 3-bit data. Hereinafter, each of the memory cells included in the memory cell array 110 will be described as a TLC, but the inventive concept is not limited thereto. For example, in another exemplary embodiment, each of the memory cells included in the memory cell array 110 may store 4-bit data or more. Also, each of the memory cells included in the memory cell array 110 may be used as a single-level cell (SLC) configured to store 1-bit data.

The write controller 122 may control an operation of storing data in the memory device 100. That is, the write controller 122 may control an operation of externally receiving data and an operation of writing data in memory cells included in the memory cell array 110. Herein, the write operation may refer to an operation of storing data externally received from the memory device 100 in at least one of the memory cells of the memory cell array 110. According to the present exemplary embodiment, the write controller 122 may prepare second data to be written to a second cell group of the memory cell array 110 during the writing of the first data to the first cell group of the memory cell array 110 before the writing of the first data is finished. Thus, after the writing of the first data is finished, the writing of the second data may be started. Each of the first and second cell groups may include memory cells to and from which data may be written and read in parallel. For example, as described below, each of the first and second cell groups may include m memory cells to and from which data may be written and read in parallel by a page buffer 150. Also, when the memory cells included in the memory cell array 110 are capable of storing n-bit data, the first and second cell groups may store n×m-bit data. The memory controller 200 may control the memory device 100 to read data stored in the memory device 100 or store data in the memory device 100 in response to read/write requests from a host HOST. Specifically, the memory controller 200 may provide an address ADDR, a command CMD, and a control signal CTRL to the memory device 100 and control a write operation, a read operation, and an erase operation on the memory device 100. Also, data to be programmed or read data DATA may be transmitted and received between the memory controller 200 and the memory device 100.

Although not shown, the memory controller 200 may include a random access memory (RAM), a processing unit, a host interface, and a memory interface. The RAM may be used as an operation memory for a processing unit, and the processing unit may control operations of the memory controller 200. The host interface may support a protocol configured to exchange data between the host HOST and the memory controller 200. As an example, the memory controller 200 may be configured to communicate with the outside (e.g., the host Host) via at least one of various interface protocols, such as a universal serial bus (USB), a multimedia card (MMC), a peripheral component interconnection-express (PCI-E), an advanced technology attachment (ATA), a serial-ATA (SATA), a parallel-ATA (PATA), a small computer small interface (SCSI), an enhanced small disk interface (ESDI), and an integrated drive electronics (IDE).

Figure 2:
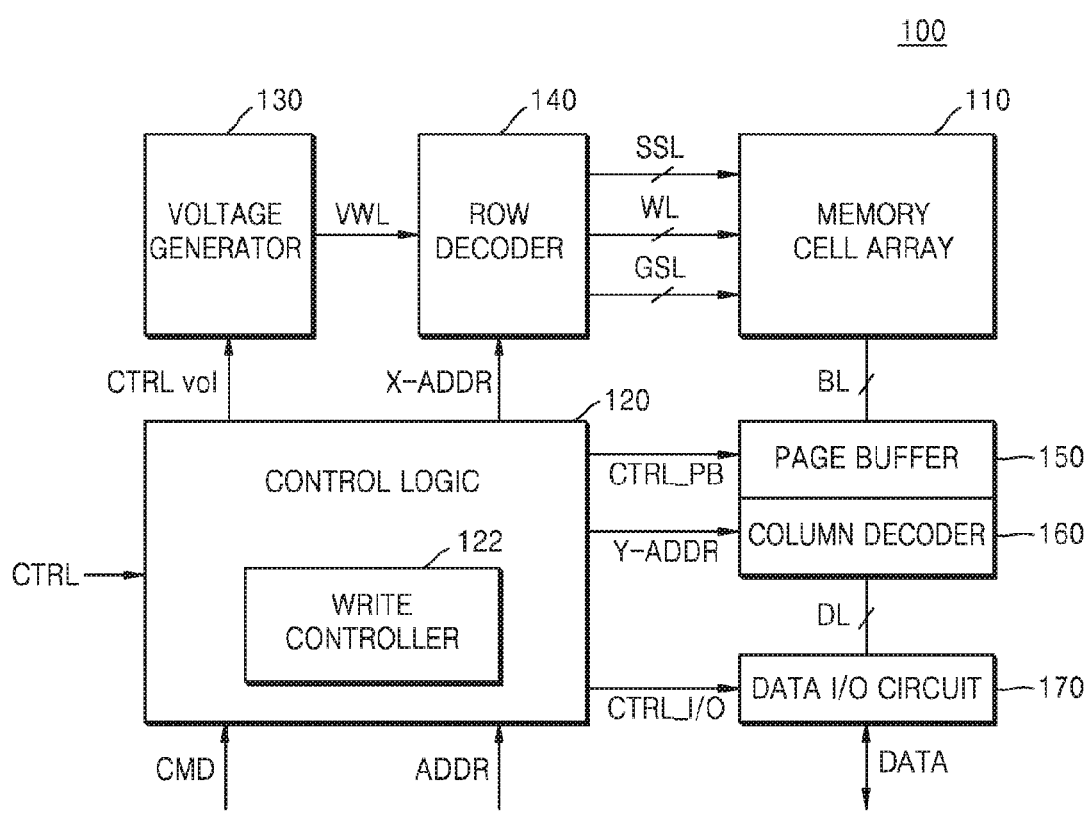
FIG. 2 is a block diagram of an example of a memory device included in the memory system of FIG. 1.

FIG. 2 is a block diagram of an example of a memory device 100 included in the memory system 10 of FIG. 1. Referring to FIG. 2, the memory device 100 may include a memory cell array 110, a control logic 120, a voltage generator 130, a row decoder 140, the page buffer 150, a column decoder 160, and a data I/O circuit 170. Hereinafter, elements included in the memory device 100 will be described in detail.

The memory cell array 110 may be connected to a plurality of word lines WL and a plurality of bit lines BL. Although not shown, the memory cell array 110 may be connected to at least one string selection line string selection line (SSL) and at least one ground selection line (GSL). The memory cell array 110 may include a plurality of memory cells (e.g., MC1 to MC8 of FIG. 5) arranged at intersection regions between a plurality of word lines WL and a plurality of bit lines BL. Each of the plurality of memory cells may store 1-bit data or multi-bit data.

When an erase voltage is applied to the memory cells of the memory cell array 110, the memory cells may be put into an erase state. When a program voltage is applied to the memory cells of the memory cell array 110, the memory cells may be put into a program state. In this case, each of the memory cells may have one of an erase state E and at least one program state, which are classified according to a threshold voltage Vth.

In an exemplary embodiment, when the memory cell is a single-level cell, the memory cell may have an erase state E and a program state P. In another exemplary embodiment, the memory cell may have one of an erase state and a plurality of program states. For example, when the memory cell is a multi-level cell, the memory cell may have one of an erase state and three program states. In another example, when the memory cell is a triple-level cell, the memory cell may have one of an erase state and seven program states.

The control logic 120 may output various internal control signals to store data in the memory cell array 110 or read data from the memory cell array 110, based on a command CMD, an address ADDR, and a control signal CTRL received from the memory controller 200. Thus, the control logic 120 may generally control various operations in the memory device 100.

The various internal control signals output by the control logic 120 may be provided to the voltage generator 130, the row decoder 140, the page buffer 150, the column decoder 160, and the data I/O circuit 170. Specifically, the control logic 120 may provide a voltage control signal CTRL_vol to the voltage generator 130, provide a row address X_ADDR to the row decoder 140, provide a page buffer control signal CTRL_PB to the page buffer 150, provide a column address Y_ADDR to the column decoder 160, and provide an I/O control signal CTRL_I/O to the data I/O circuit 170. However, the inventive concept is not limited thereto, and the control logic 120 may further provide other internal control signals to the voltage generator 130, the row decoder 140, the page buffer 150, the column decoder 160, and the data I/O circuit 170.

The voltage generator 130 may generate various kinds of voltages for performing a program operation, a read operation, and an erase operation on the memory cell array 110, in response to the voltage control signal CTRL_vol. Specifically, the voltage generator 130 may generate a word line driving voltage VWL for driving a plurality of word lines WL. In this case, the word line driving voltage VWL may be a program voltage (or a write voltage), a read voltage, an erase voltage, an inhibition voltage, or a program verification voltage. Although not shown, the voltage generator 130 may further generate a string selection line driving voltage VSSL for driving a plurality of string selection lines SSL and a ground selection line driving voltage VGSL for driving a plurality of ground selection lines GSL.

The row decoder 140 may be connected to the memory cell array 110 through a plurality of word lines WL, and enable some of the plurality of word lines WL in response to the row address X_ADDR received from the control logic 120. Specifically, in a read operation, the row decoder 140 may apply a read voltage to a selected word line and apply a non-selection voltage to an unselected word line. Also, in a program operation, the row decoder 140 may apply a program voltage to a selected word line and apply a non-program voltage to an unselected word line.

The page buffer 150 may be connected to the memory cell array 110 through a plurality of bit lines BL and perform a program operation or a read operation in response to a page buffer control signal CTRL_PB received from the control logic 120. Specifically, in a read operation, the page buffer 150 may operate as a sense amplifier and output data DATA stored in the memory cell array 110. Meanwhile, in a program operation, the page buffer 150 may operate as a write driver and store desired data DATA in the memory cell array 110. The page buffer 150 may be configured to write data in parallel in m memory cells of the plurality of memory cells included in the memory cell array 110 or read data in parallel from the m memory cells. Specific operations of the page buffer 150 will be described in detail later with reference to FIGS. 7 and 8.

Although not shown, the memory device 100 may include a multiplexer (not shown), which may be interposed between the memory cell array 110 and the page buffer 150. The multiplexer may be connected to the memory cell array 110 through the bit lines BL, and connect some of the bit lines BL with the page buffer 150 based on an internal control signal received from the control logic 120.

The column decoder 160 may be connected to the page buffer 150 and connected to the data I/O circuit 170 through the data lines DL. The column decoder 160 may connect some of lines connected to the page buffer 150 with the data lines DL in response to the column address Y-ADDR received from the control logic 120.

The data I/O circuit 170 may transmit externally input data DATA through the data lines DL to the column decoder 160 or transmit data DATA, which is output from the column decoder 160, through a plurality of input/output (I/O) pins or a data bus of the memory device 100 to the outside of the memory device 100 (e.g., the memory controller 200 of FIG. 1).

In the present exemplary embodiment, the control logic 120 may include the write controller 122. As described above with reference to FIG. 1, the write controller 122 may control a write operation on memory cells included in the memory cell array 110. Specifically, according to the present exemplary embodiment, the write controller 122 may prepare second data to be written to the second cell group of the memory cell array 110 during the writing of the first data to the first cell group of the memory cell array 110 before the writing of the first data is finished. For example, a capacity corresponding to each of the first and second cell groups may be an integer multiple of a page. Hereinafter, operations of the write controller 122 related to the writing of the first and second data will be schematically described, and specific operations of the write controller 122 will be described in detail with reference to FIGS. 6 to 17.

The write controller 122 may control the page buffer 150, the column decoder 160, and the data I/O circuit 170 such that first data to be written to the first cell group of the memory cell array 110 is stored in latches included in the page buffer 150. For example, the write controller 122 may generate an I/O control signal CTRL_I/O such that the data I/O circuit 170 receives first data. The write controller 122 may generate a column address Y-ADDR corresponding to the first cell group. The write controller 122 may generate a page buffer control signal CTRL_PB such that the first data is stored in the latches included in the page buffer 150.

The write controller 122 may control the voltage generator 130, the row decoder 140, and the page buffer 150 to start the writing of the first data stored in the latches of the page buffer 150. For example, the write controller 122 may generate a control signal CTRL_vol such that the voltage generator 130 generates a program voltage. The write controller 122 may generate a row address X-ADDR such that the row decoder 140 enables a word line corresponding to the first cell group. The write controller 122 may generate a page buffer control signal CTRL_PB such that the page buffer 150 outputs a signal corresponding to the first data through the bit lines BL to the memory cell array 110.

The write controller 122 may control the page buffer 150, the column decoder 160, and the data I/O circuit 170 such that second data to be written to the second cell group of the memory cell array 110 is stored in the latches included in the page buffer 150 during the writing of the first data. For example, the write controller 122 may generate an I/O control signal CTRL_I/O such that the data I/O circuit 170 receives second data, generate a column address Y-ADDR corresponding to the second cell group, and generate a page buffer signal CTRL_PB such that the latches included in the page buffer 150 store the second data. In the present exemplary embodiment, before the writing of the first data in the first cell group is finished, the storing of the second data in the latches of the page buffer 150 may be finished. Thus, the writing of the second data may be started immediately after the writing of the first data is finished.

In the present exemplary embodiment, the write controller 122 may be a software module or a hardware module for generating the above-described control signals. For example, the control logic 120 may include a processor and a memory configured to store commands performed by the processor, and the write controller 122 may be a software module stored in the memory. In another example, the control logic 120 may be a hardware module, such as a finite state machine (FSM), which is triggered in response to, for example, a control signal CTRL or a command CMD.

FIG. 3 illustrates an example 110' of the memory cell array 110 included in the memory device 100 of FIG. 2. Referring to FIG. 3, the memory cell array 110' may include a plurality of memory blocks BLK1 to BLKi.

Each of the plurality of memory blocks BLK to BLKi may have a 3D structure (or vertical structure). Specifically, each of the plurality of memory blocks BLK to BLKi may include structures, which may extend along first to third directions. For example, each of the memory blocks BLK to BLKi may include a plurality of strings or NAND strings, which may extend in a second direction. In this case, the plurality of strings may be provided at a predetermined distance apart from one another in first and third directions.

The plurality of memory blocks BLK1 to BLKi may be selected by the row decoder 140 of FIG. 2. For example, the row decoder 140 may select a memory block corresponding to a block address, from among the memory blocks BLK1 to BLKi. In this case, each of the memory blocks BLK1 to BLKi may be connected to a plurality of bit lines BL, a plurality of string selection lines SSL, a plurality of word lines WL, a ground selection line GSL, and a common source line CSL. The memory blocks BLK1 to BLKz will be described in further detail with reference to FIG. 4.

FIG. 4 is a perspective view of an example of the first memory block BLK1, which is one of the plurality of memory blocks BLK1 to BLKi of FIG. 3. Referring to FIG. 4, the first memory block BLK1 may be formed in a direction perpendicular to a substrate SUB. Although FIG. 4 illustrates a case in which the first memory block BLK1 includes two selection lines GSL and SSL, eight word lines WL1 to WL8, and three bit line BL1 to BL3, the first memory block BLK1 may actually include smaller or larger numbers of selection lines, word lines, and bit lines than illustrated in FIG. 4.

The substrate SUB may have a first conductivity type (e.g., a p type). Common source lines CSL may be arranged on the substrate SUB. The common source lines CSL may extend in a first direction and be doped with impurities of a second conductivity type (e.g., an n type). A plurality of insulating layers IL may be arranged on a region of the substrate SUB between two adjacent common source lines CSL. The plurality of insulating layers IL may extend in the first direction and be sequentially provided in a second direction. The plurality of insulating layers IL may be spaced a predetermined distance apart from one another in the second direction. For example, the plurality of insulating layers IL may include an insulating material, such as silicon oxide.

A plurality of pillars P may be formed on a region of the substrate SUB between two adjacent common source lines CSL. The plurality of pillars P may be sequentially arranged in the first direction and penetrate a plurality of insulating layers IL in the second direction. For example, the plurality of pillars P may penetrate the plurality of insulating layers IL and contact the substrate SUB. Specifically, a surface layer S of each of the pillars P may include a silicon material of the first conductivity type and function as a channel region. Meanwhile, an inside I of each of the pillars P may include an insulating material (e.g., silicon oxide) or an air gap.

A charge storage layer CS may be formed in a region between two adjacent common source lines CSL along exposed surfaces of the insulating layers IL, the pillars P, and the substrate SUB. For example, the charge storage layer CS may have an oxide-nitride-oxide (ONO) structure. Also, a gate electrode GE may be provided in the region between the two adjacent common source lines CSL on an exposed surface of the charge storage layer CS.

Drains DR may be respectively arranged on the plurality of pillars P. For example, the drains DR may include a silicon material doped with impurities having the second conductivity type. Bit lines BL may be arranged on the drains DR. The bit lines BL may extend in a third direction and be spaced a predetermined distance apart from one another in the first direction.

Figure 5:
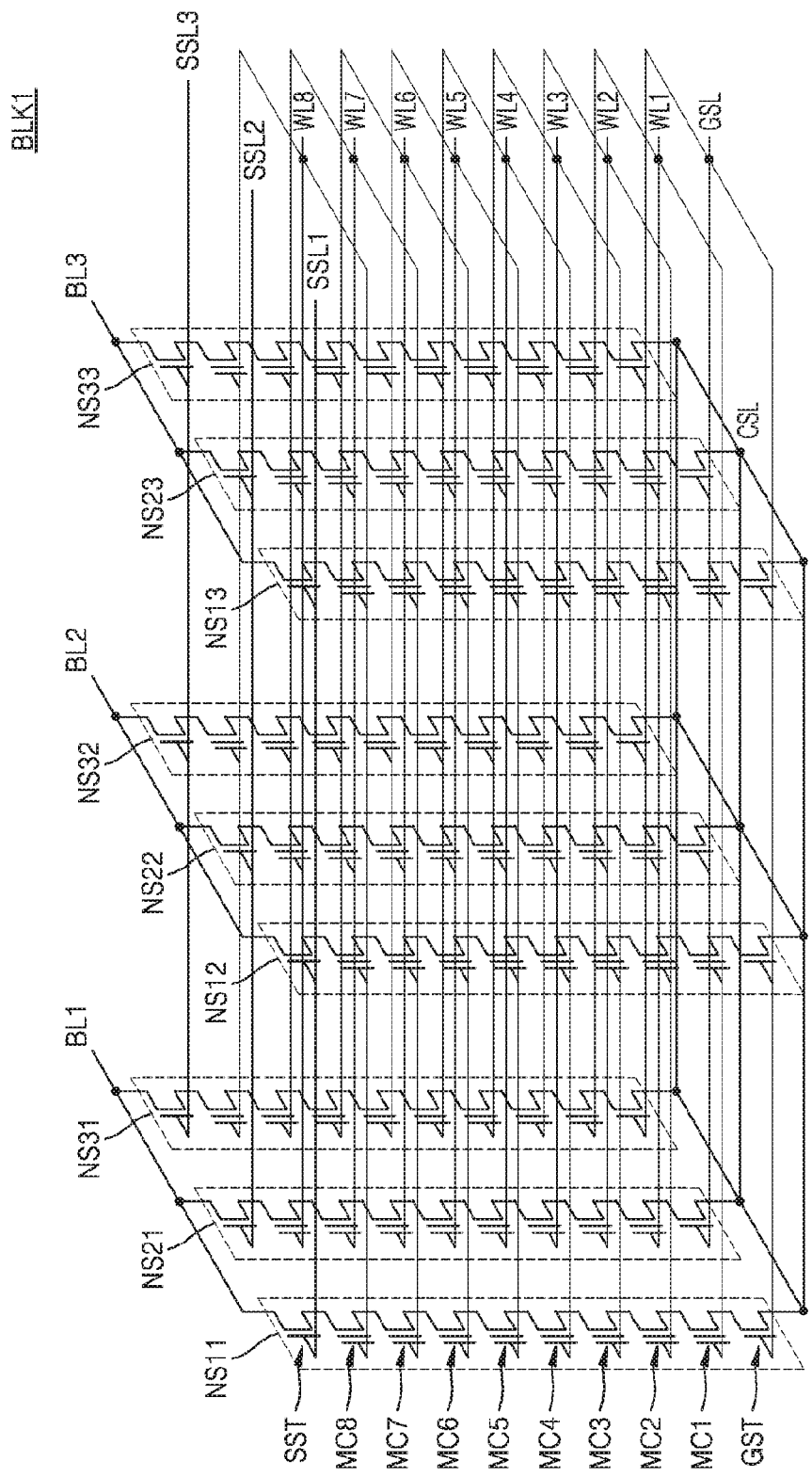
FIG. 5 is an equivalent circuit diagram of the first memory block of FIG. 4.

FIG. 5 is an equivalent circuit diagram of the first memory block BLK1 of FIG. 4. Referring to FIG. 5, the first memory block BLK1 may be a VNAND flash memory, and each of the memory blocks BLK1 to BLKi shown in FIG. 3 may be expressed as shown in FIG. 5.

Referring to FIG. 5, the first memory block BLK1 may include a plurality of NAND strings (e.g., NS11 to NS33), a plurality of word lines (e.g., WL1 to WL8), a plurality of bit lines (e.g., BL1 to BL3), a ground selection line GSL, a plurality of string selection lines (e.g., SSL1 to SSL3), and a common source line CSL. The number of NAND strings, the number of word lines, the number of bit lines, the number of ground selection lines, and the number of string selection lines may be variously changed according to exemplary embodiments.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each of the NAND strings (e.g., NS11) may include a string selection transistors SST, a plurality of memory cells MC1 to MC8, and a ground selection transistor GST, which may be connected in series. Hereinafter, the NAND string will be referred to as a string for brevity.

Strings connected in common to one bit line may constitute one column. For example, strings NS11, NS21, and NS31 connected in common to the first bit line BL1 may correspond to a first column, strings NS12, NS22, and NS32 connected in common to the second bit line BL2 may correspond to a second column, and strings NS13, NS23, NS33 connected in common to the third bit line BL3 may correspond to a third column.

Strings connected to one string selection line may constitute one row. For example, strings NS11, NS12, and NS13 connected to the first string selection line SSL1 may correspond to a first row, strings NS21, NS22, and NS23 connected to the second string selection line SSL2 may correspond to a second row, and strings NS31, NS32, and NS33 connected to the third string selection line SSL3 may correspond to a third row.

The plurality of memory cells MC1 to MC8 may be connected to the respectively corresponding ones of the word lines WL1 to WL8. The string selection transistor SST may be connected to the string selection lines SSL1 to SSL3, and the ground selection transistor GST may be connected to the ground selection line GSL. Also, the string selection transistor SST may be connected to the corresponding bit line BL, and the ground selection transistor GST may be connected to the common source line CSL.

Word lines (e.g., WL1) arranged at the same height may be connected in common, and the string selection lines SSL1 to SSL3 may be separated from one another. A plurality of NAND strings or a plurality of memory cells connected to the same string line, from among the plurality of string selection lines SSL1 to SSL3, may be referred to as a plane. For example, NAND strings NS11, NS12, and NS13 connected to the first string selection line SSL1 may be referred to as one plane.

One of the plurality of string selection lines SSL1 to SSL3 may be selected and one of the plurality of word lines WL1 to WL8 may be selected so that memory cells to be programmed may be selected. For example, when the first string selection line SSL1 is selected and a program voltage is applied to the first word line WL1, memory cells, which are included in the NAND strings NS11, NS12, and NS13 of the first row and connected to the first word line WL1, may be programmed That is, m memory cells, which are selected by one string selection line and one word line, may be programmed at the same time. Thus, when each of the plurality of memory cells MC1 to MC8 is a single-level cell, a data unit that may be simultaneously programmed to m memory cells may be referred to as a page (or page data), which may be m-bit data. Accordingly, when each of the memory cells MC1 to MC8 is a triple-level cell, memory cells selected by one string selection line and one word line may store three pages, namely, 3 m-bit data (i.e., triple m-bit data).

Figure 6:
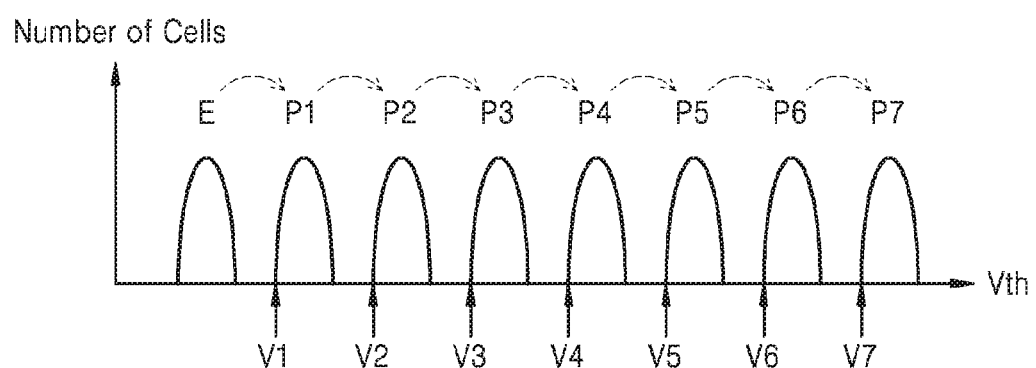
FIG. 6 is a graph showing a distribution of threshold voltages of memory cells after a data write operation is finished.

FIG. 6 is a graph showing a distribution of threshold voltages of memory cells after the writing of data is finished. Specifically, FIG. 6 illustrates an example in which each of the memory cells is a triple-level cell capable of storing 3-bit data. In FIG. 6, an abscissa denotes a threshold voltage Vth, and an ordinate denotes the number of memory cells.

Referring to FIG. 6, the memory cell may have one of an erase state E and first to seventh program states P1 to P7. The erase state E and the first to seventh program states P1 to P7 may respectively correspond to eight different data which may be represented by 3-bit. A state of the memory cell may be determined to be one of the erase state E and the first to seventh program states P1 to P7 by using voltages between adjacent states, and thus data stored in the memory cell may be determined.

The memory cell may make the transition from the erase state E to any one of the first to seventh program states P1 to P7 due to a threshold voltage applied through a word line connected to the memory cell. A threshold voltage Vth of the memory cell may rise (e.g., move rightward in FIG. 6) based on a program pulse. The memory cell may be verified due to first to seventh verification voltages V1 to V7 so that the threshold voltage Vth of the memory cell may move to a value corresponding to a desired state. Thus, an operation of writing data in the memory cell may include repeating a program operation of applying a program pulse and a verification operation using a verification voltage.

The memory cell may have the erase state E before data is written, and there may be various program methods for putting the memory cell into a final state corresponding to data to be stored in the memory cell. Referring to FIGS. 2 and 6, the write controller 122 may write data in the memory cell of the memory cell array 110 based on one of the various program methods according to characteristics of the memory device 100, for example, physical characteristics of the memory cell array 110.

According to the present exemplary embodiment, when a data write operation is started, data having 2 bits or more may be required. To determine whether a program pulse applied to the memory cell is inhibited or whether the memory cell has reached a final state in the erase state E, when the data write operation is started, data having 2 bits or more (e.g., 3-bit data in a triple-level cell) may be required. For example, the memory cell may sequentially make the transition to the first to seventh program states P1 to P7 and have a final state corresponding to data stored in the memory cell. This program method may be referred to as a sequential shift programming method. That is, when a state corresponding to data to be stored in the memory cell is the seventh program state P7, the memory cell may sequentially make the transition from the erase state E to the first to sixth program states P1 to P6, and finally make the transition from the sixth program state P6 to the seventh program state P7. Similarly, in a reprogramming method for memory cells connected to an adjacent word line, data having 2 bits or more may be required. Hereinafter, FIG. 2 illustrates an example in which the write controller 122 writes data in a memory cell (i.e., a triple-level cell) of the memory cell array 110 by using the sequential shifting programming method, but the inventive concept is not limited thereto.

Referring to FIGS. 5 and 6, to perform the sequential shift programming method, before data is written to m memory cells, which are selected by one string selection line and one word line and each of which is a triple-level cell, three pages may be required. The write controller 122 of FIG. 2 may generate internal control signals such that latches included in the page buffer 150 store three pages (i.e., 3 m-bit data) before the program pulse is applied to the memory cell array 110.

Figure 7:
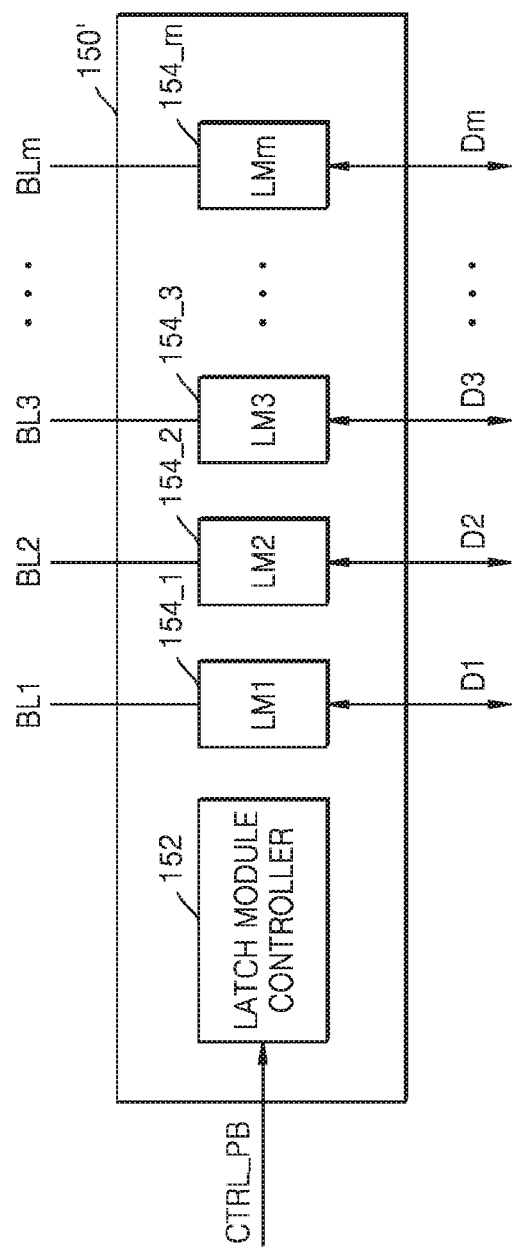
FIG. 7 is a block diagram that illustrates an example of a page buffer included in the memory device of FIG. 2.

FIG. 7 illustrates an example 150' of the page buffer 150 included in the memory device 100 of FIG. 2. Referring to FIG. 7, the page buffer 150' may include a latch module controller 152 and m latch modules 154_1 to 154_m. Hereinafter, the page buffer 150' will be described in detail with reference to FIGS. 2 and 7.

The latch module controller 152 may receive a page buffer control signal CTRL_PB generated by the write controller 122 from the control logic 120 and control m latch modules 154_1 to 154_m based on the page buffer control signal CTRL_PB. For example, the latch module controller 152 may store data D1 to Dm, which is transmitted to the page buffer 150', in the m latch modules 154_1 to 154_m based on the page buffer control signal CTRL_PB, and output signals to the bit lines BL1 to BLm in response to data stored in the m latch modules 154_1 to 154_m. Also, the latch module controller 152 may receive signals from the memory cell array 110 through the bit lines BL1 to BLm based on the page buffer control signal CTRL_PB, and output the data D1 to Dm in response to the received signals.

According to the present exemplary embodiment, the page buffer 150' may include m latch modules 154_1 to 154_m in equal number to the number of memory cells selected by one string selection line and one word line. Thus, data may be written in parallel in the m memory cells or data may be read in parallel from the m memory cells.

Figure 8:
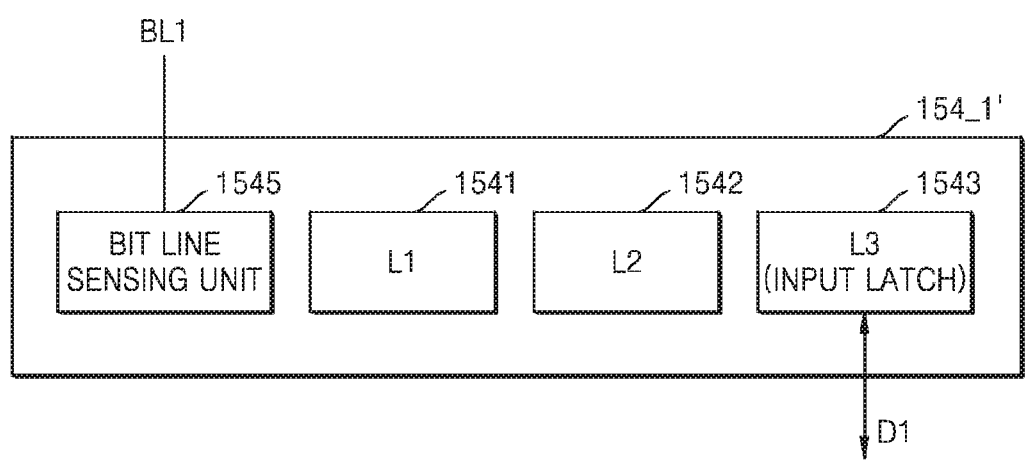
FIG. 8 is a block diagram that illustrates an example of a first latch module included in the page buffer of FIG. 7.

FIG. 8 illustrates an example 154_1' of the first latch module 154_1 included in the page buffer 150' of FIG. 7. Referring to FIG. 8, the first latch module 154_1' may include a bit line sensing unit 1545 and first to third latches 1541 to 1543. Hereinafter, the first latch module 154_1' will be described in detail with reference to FIGS. 2 and 8.

The bit line sensing unit 1545 may be connected to the memory cell array 110 through a first bit line BL1. The bit line sensing unit 1545 may sense a signal input through the first bit line BL1 or output the signal to the first bit line BL1. For example, the bit line sensing unit 1545 may include a sense latch. The bit line sensing unit 1545 may sense the signal input through the first bit line BL1) and store generated data in the sense latch or output a signal to the first bit line BL1 based on the data stored in the sense latch. The sense latch may be connected to other latches (e.g., first to third latches 1541 to 1543) included in the first latch module 154_1' and transmit and receive data to and from the first to third latches 1541 to 1543.

In the memory cell array 110, as a physical size of memory cells has been reduced and the integration density of the memory cells has increased, a physical size of the page buffer 150 may become relatively significant. Thus, each of the latch modules 154_1 to 154_m included in the page buffer 150 may be configured to include a minimum number of latches required for a write operation and a read operation. Accordingly, at least one of the latches included in each of the latch modules 154_1 to 154_m may store data, which changes over time for various purposes, instead of retaining certain data during one program operation and one read operation.

The first to third latches 1541 to 1543 may store 3-bit data to be written to the memory cell (or converted 3-bit data corresponding one-to-one to 3-bit data to be written to the memory cell). The bit line sensing unit 1545 may output signals through the first bit line BL1 based on data stored in the first to third latches 1541 to 1543.

One of the first to third latches 1541 to 1543 may be connected to the first data line DL1 through the column decoder 160. A latch connected to a data line DL through the column decoder 160 may be referred to as an input latch. In the example 154_1' of FIG. 8, the third latch 1543 may be referred to as an input latch. Each of the first and second latches 1541 and 1542 may receive 1-bit data from the input latch 1543. Accordingly, the page buffer 150 may include m input latches.

The input latch 1543 may be arranged a greater distance apart from other latches included in the first latch module 154_1' than a distance between the other latches included in the first latch modules 154_1' so that the input latch 1543 may exchange data with the data I/O circuit 170 through the column decoder 160. For example, since a time taken to transfer data between the input latch 1543 and the data I/O circuit 170 through the column decoder 160 is longer than a time taken to transfer data between the input latch 1543 and the latches included in the first latch module 154_1', the input latch 1543 may be arranged at a greater distance apart from the other latches included in the first latch module 154_1' than a distance between the other latches included in the first latch module 154_1'.

Although not shown, the first latch module 154_1' may further include an additional latch. For example, the first latch module 154_1' may further include a latch configured to store information generated during a process of programming memory cells through the first bit line BL1.

Figure 9:
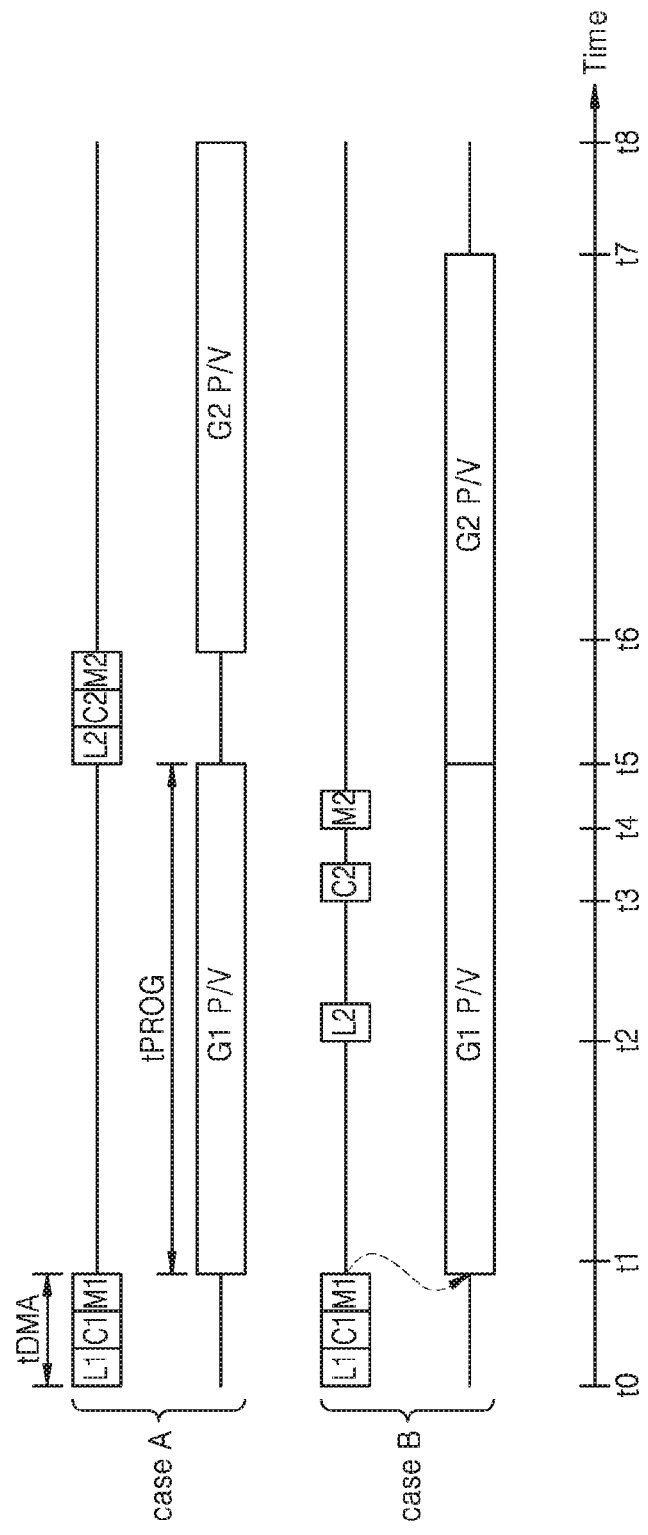
FIG. 9 is a timing diagram of a data write operation according to an exemplary embodiment.

FIG. 9 is a timing diagram of an operation of storing data according to an exemplary embodiment. Specifically, FIG. 9 shows a case A of a typical storage operation and a case B in which a time taken to perform a storage operation is reduced. Hereinafter, an operation of storing data will be described in detail with reference to FIGS. 2 and 9.

Referring to the case A, the memory device 100 may receive first data to be written to a first cell group of the memory cell array 110 from the outside (e.g., the memory controller 200 of FIG. 1) of the memory device 100. The first data may have a size of three pages. In FIG. 9, the three pages are indicated by 'L1', 'C1', and 'M1', respectively. The memory device 100 may receive from a time point 't0' to a time point 't1', namely, for a time duration 'tDMA'. Specifically, the write controller 122 may receive the first data through the data I/O circuit 170 and generate internal control signals to store the received first data in latches of the page buffer 150.

The memory device 100 may write the first data in the first cell group. Specifically, the write controller 122 may generate internal control signals to write the first data in the first cell group of the memory cell array 110. As described above with reference to FIG. 6, an operation of writing the first data may include repeating a program operation and a verification operation may take a relatively large amount of time. That is, a time duration 'tPROG' taken to write the first data to the first cell group may be larger than the time duration 'tDMA' taken to receive the first data.

When the writing of the first data is finished at a time point 't5', the memory device 100 may receive second data to be written to a second cell group of the memory cell array 110 from the outside of the memory device 100, and write the received second data to the second cell group. Like the case of the first data, the time duration 'tDMA' may be taken to receive the second data, and the time duration 'tPROG' may be taken to write the second data to the second cell group. The writing of the second data may be finished at a time point 't8'. As a result, a time duration '2tDMA+2tPROG' may be taken to write the first and second data to the memory device 100.

Next, referring to the case B in which the time taken to perform the storage operation is reduced, similar to the case A, the writing of first data may be finished at a time point 't5'. However, in the case B, during the writing of the first data to the first cell group of the memory cell array 110 (i.e., for a time duration 'tPROG'), the memory device 100 may receive second data to be written to the second cell group of the memory cell array 110. Specifically, while generating internal control signals to write the first data to the first cell group of the memory cell array 110, the write controller 122 may generate internal control signals to receive three pages L2, C2, and M2 of the second data at time points 't2', 't3', and 't4', respectively.

A final page of the second data may be received before the time point 't5' at which the writing of the first data is finished, and an operation of writing the second data to the second cell group of the memory cell array 110 may be started at the time point 't5'. Specifically, the write controller 122 may generate internal control signals to write the second data stored in the latches of the page buffer 150 to the second cell group of the memory cell array 110. The writing of the second data may be finished at a time point 't7'. As a result, a time duration 'tDMA+2tPROG' may be taken to store the first and second data in the memory device 100. Accordingly, a time duration taken to store the first and second data in the memory device 100 may be reduced by as much as the time duration 'tDMA'. Although FIG. 9 illustrates the first and second data, a time duration taken to store data in the memory device 100 may be further reduced as the amount of data to be stored in the memory device 100 increases.

Figure 10:
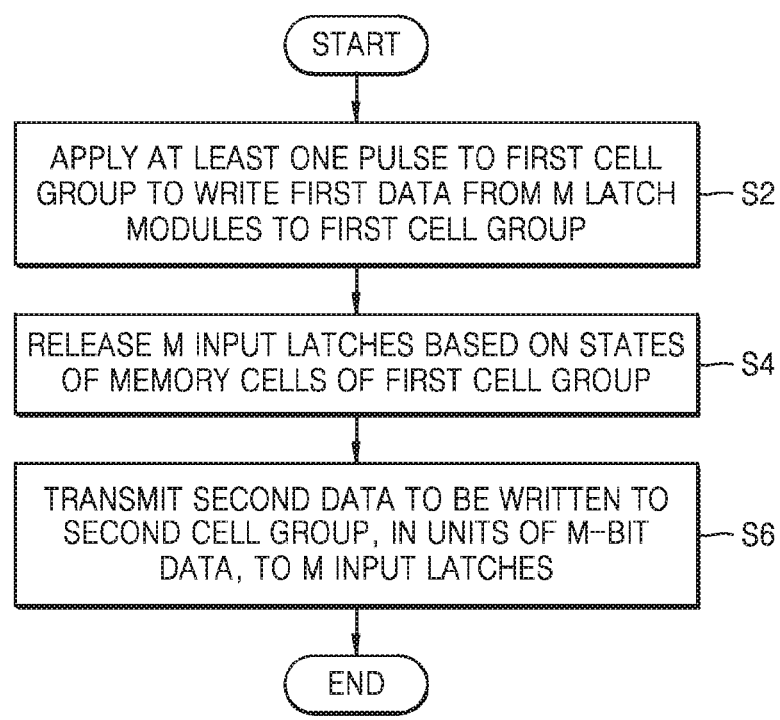
FIG. 10 is a flowchart of a method of operating a memory device according to an exemplary embodiment.

FIG. 10 is a flowchart of a method of operating a memory device according to an exemplary embodiment. Specifically, FIG. 10 is a flowchart of a method of receiving part of second data during the writing of first data (i.e., for a time duration 'tPROG'). Respective operations included in the method of operating the memory device shown in FIG. 10 may be controlled in response to internal control signals generated by the write controller 122 of FIG. 1 or 2. Hereinafter, the method of operating the memory device will be described in detail with reference to FIGS. 2, 7, and 10.

In operation S2, an operation of applying at least one pulse to a first cell group may be performed to write first data from m latch modules 154_1 to 154_m to the first cell group. A threshold voltage of at least one of the memory cells included in the first cell group may be changed in response to an applied pulse so that the at least one of the memory cells may make the transition from an original state to another state. Detailed descriptions of operation S2 will be presented below with reference to FIG. 14.

In operation S4, an operation of releasing m input latches may be performed based on states of memory cells of the first cell group. The releasing of a latch may indicate that the latch reaches a state in which the latch may store new data. That is, by releasing the m input latches, the m input latches may be put into a state in which the m input latches may store new m-bit data (i.e., m-bit data of second data). Specific descriptions of operation S4 will be presented below with reference to FIGS. 11 to 13 and 15A to 16.

In operation S6, an operation of transmitting second data to be written to the second cell group, in units of m-bit data, to the m released input latches. Before the writing of the first data is finished (i.e., at a time point in which the application of some of a plurality of pulses to the first cell group is finished before the writing of the first data is finished), m-bit data of the second data may be transmitted, and the transmitted m-bit data may be retained until the writing of the first data is finished. All pieces of m-bit data of the second data may be transmitted until the writing of the first data is finished. Thus, the writing of the second data may be started immediately after the writing of the first data is finished.

Specific descriptions of operation S5 will be presented below with reference to FIG. 17.

Figure 11:
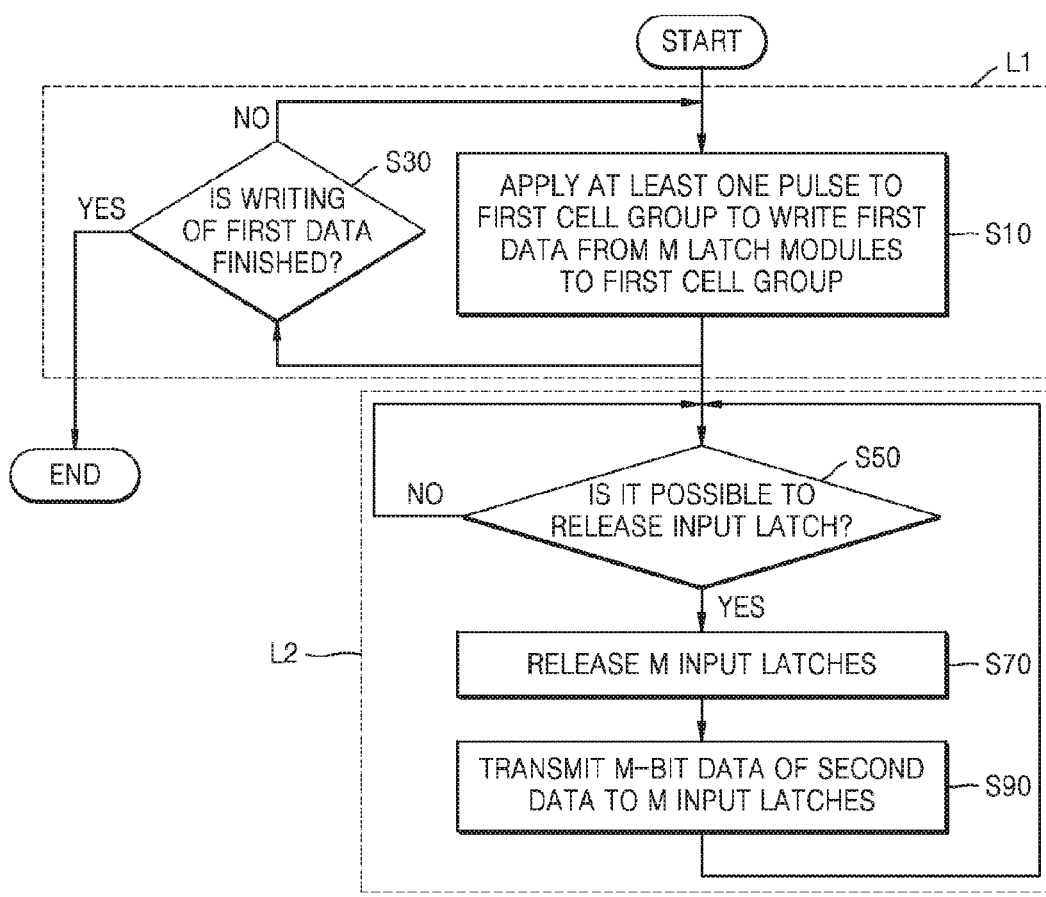
FIG. 11 is a flowchart of a data write method of a memory device according to an exemplary embodiment.

FIG. 11 is a flowchart of a method of writing data in a memory device according to an exemplary embodiment. Specifically, FIG. 11 is a flowchart of a method of writing first data to a first cell group. Respective operations included in the method of writing data in the memory device shown in FIG. 11 may be controlled in response to internal control signals generated by the write controller 122 of FIG. 1 or 2. Hereinafter, the method of writing data in the memory device will be described in detail with reference to FIGS. 2 and 11.

In operation S10, an operation of applying at least one pulse to the first cell group may be performed to write the first data from m latch modules to the first cell group. Since operation S10 is similar to operation S2 of FIG. 10, repeated descriptions of operation S10 are omitted.

In operation S30, an operation of determining whether the writing of the first data is finished may be performed. For example, when m memory cells included in the first cell group are changed into states corresponding to the first data, the writing of the first data may be determined as being finished. Specifically, the write controller 122 may receive a pass/fail signal from a pass/fail circuit included in the page buffer 150 and determine whether the memory cells are changed into the states corresponding to the first data based on the pass/fail signal. When the writing of the first data is finished, the operation of writing the first data may be ended. However, when the writing of the first data is not finished, at least one pulse may be applied to the first cell group due to operation S10. That is, operation S10 and operation S30 may form a first loop L1.

In operation S50, an operation of determining whether it is possible to release the input latch may be performed. It may be determined whether it is possible to release the m input latches included in the m latch modules of the page buffer 150, based on the states of the m memory cells of the first cell group, which are changed due to the pulse applied to the first cell group. Detailed descriptions of operation S50 will be described below with reference to FIGS. 12A, 12B, and 13.

In operation S70, when it is determined that it is possible to release the input latch, an operation of releasing the m input latches may be performed. The operation of releasing the m input latches may include dumping data stored in the m input latches to other m latches. Detailed descriptions of operation S70 will be presented below with reference to FIG. 16.

In operation S90, an operation of transmitting m-bit data, which is part of second data, to the m input latches may be performed. Since the m input latches are released in operation S70, the m input latches may store m-bit data of second data, which is new data. Since operation S90 is similar to operation S6, repeated descriptions of operation S90 are omitted.

Referring to FIG. 11, operations S50, S70, and S90 may form a second loop L2. According to an exemplary embodiment, the first loop L1 may be performed until the writing of the first data is finished, independent of the second loop L2. In the second loop L2, due to operation S50, operations S70 and S90 may be selectively performed based on the states of the memory cells of the first cell group, which are changed due to the first loop L1 (i.e., operation S10).

Figure 12A:
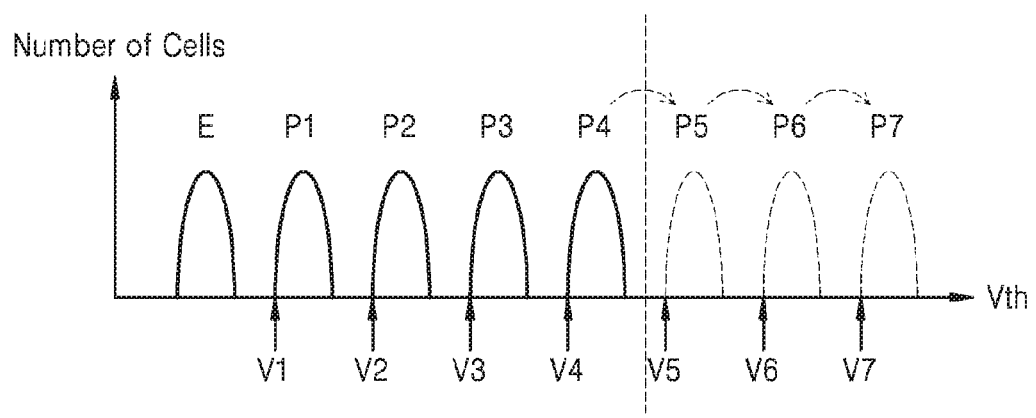
FIGS. 12A and 12B are graphs showing distributions of threshold voltages of memory cells during a data write operation.
Figure 12B:
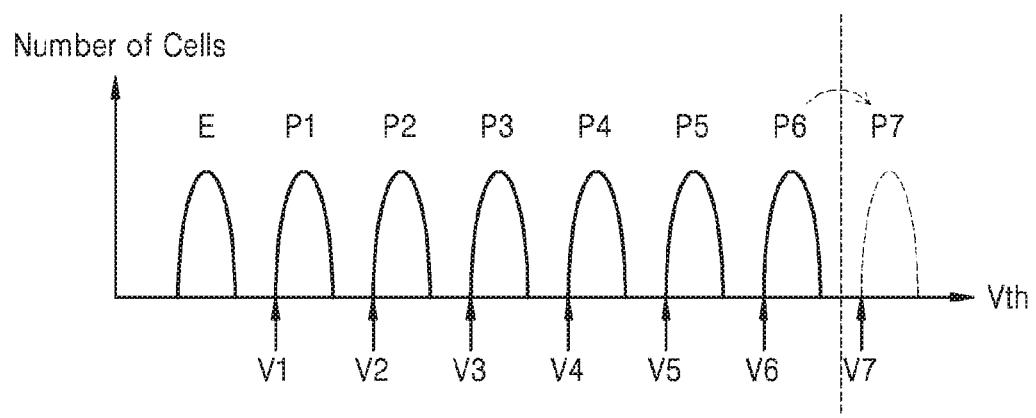

FIGS. 12A and 12B are graphs showing distributions of threshold voltages of memory cells during an operation of writing data. Specifically, FIGS. 12A and 12B are graphs showing distributions of threshold voltages of memory cells at two different time points during an operation of writing data to memory cells (i.e., memory cells of a first cell group or memory cells of a second cell group) selected by one string selection line and one word line, by using a sequential shift programming method. Hereinafter, the graphs of FIGS. 12A and 12B will depict distributions of threshold voltages of memory cells included in a first cell group during the writing of first data. In FIGS. 12A and 12B, it will be understood that sizes of the distributions are provided in a descriptive sense only and are not actually to scale.

Referring to FIG. 12A, the first cell group may include memory cells, which may have an erase state E and first to fourth programming states P1 to P4, respectively, due to a sequential shift programming method. In this case, it may be determined that memory cells having the erase state E and the first to third program states P1 to P3 illustrated respectively with solid lines in FIG. 12A have reached a final state corresponding to first data. Also, it may be determined that some of memory cells having the fourth program state P4 illustrated with a solid line in FIG. 12A have reached the final state.

The memory cells having the fourth program state P4 illustrated with the solid line in FIG. 12A may have a memory cell of which the final state corresponding to the first data is one of the fifth to seventh program states P5 to P7. In response to an additionally applied pulse, some of the memory cells having the fourth program state P4 may be changed into a final state that is one of the fifth to seventh program states P5 to P7.

When an additional pulse is applied to the first cell group in the distributions of the threshold voltages of the memory cells as shown in FIG. 12A, the first cell group may include memory cells, which remain in the current state, and memory cells, which are changed into a final state that is one of the fifth to seventh program states P5 to P7. Accordingly, an operation of writing first data at a time point shown in FIG. 12A may include four total cases, which may be expressed by 2-bit data. Thus, referring to FIG. 8, one latch (e.g., a third latch 1543 serving as an input latch) of the first to third latches 1541 to 1543 may be released.

Referring to FIG. 12B, the first cell group may include memory cells, which may have an erase state E and first to sixth programming states P1 to P6, respectively, due to a sequential shift programming method. Similar to the descriptions of FIG. 12A, it may be determined that memory cells having the erase state E and the first to sixth program states P1 to P6 illustrated respectively with solid lines in FIG. 12B have reached a final state corresponding to first data. Also, it may be determined that some of memory cells having the sixth program state P6 illustrated with a solid line in FIG. 12B have reached the final state.

The memory cells having the sixth program state P6 illustrated with the solid line in FIG. 12B may have a memory cell of which the final state corresponding to the first data is the seventh program state P7. In response to an additionally applied pulse, some of the memory cells having the sixth program state P6 may be changed into the seventh program state P7.

When an additional pulse is applied to the first cell group in the distributions of the threshold voltages of the memory cells as shown in FIG. 12B, the first cell group may include memory cells, which remain in the current state, and memory cells, which are changed into the seventh program state P7. Accordingly, an operation of writing first data at a time point shown in FIG. 12B may include two total cases, which may be expressed by 1-bit data. Thus, referring to FIG. 8, two latches of the first to third latches 1541 to 1543 may be released. That is, when one latch is released at a time point of the data write operation shown in FIG. 12A, one more latch may be released at a time point of the data write operation shown in FIG. 12B.

FIGS. 12A and 12B illustrate only examples of the time points at which latches are released, and the inventive concept is not limited thereto. Thus, in other exemplary embodiments, latches may be released at different time points from the time points shown in FIGS. 12A and 12B. For example, as described above with reference to FIG. 8, data stored in latches included in the first latch module 154_1' during an operation of writing first data may be changed. Alternatively, the bit line sensing unit 1545 may include a sense latch. Alternatively, the first latch module 154_1' may further include an additional latch. Thus, one latch may be released before the time point shown in FIG. 12A. Alternatively, at least two latches may be simultaneously released at a specific time point.

Figure 13:
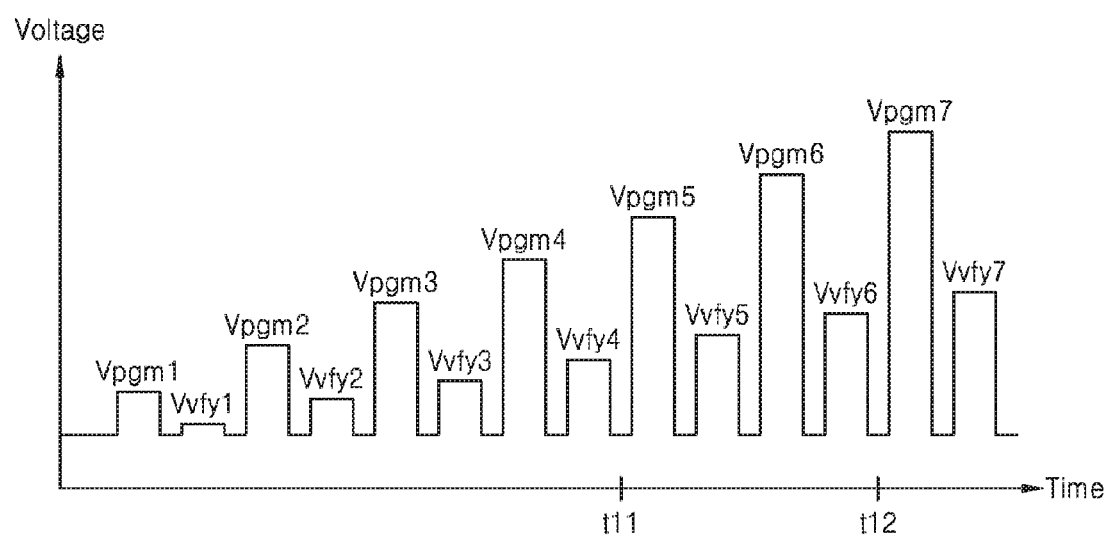
FIG. 13 is a graph of pulses applied to memory cells during a data write operation.

FIG. 13 is a graph showing pulses applied to a memory cell during a data write operation (i.e., for a time duration 'tPROG'). Specifically, FIG. 13 shows pulses applied to a triple-level cell, and more pulses than the pulses shown in FIG. 13 may be applied to write data in the triple-level cell. Hereinafter, the graph of FIG. 13 will be described as depicting pulses applied to the first cell group with reference to FIGS. 12A and 12B. In FIG. 13, it will be understood that sizes of the pulses are provided in a descriptive sense only and are not actually to scale.

The pulses applied to the first cell group may include program pulses Vpgm1 to Vpgm7 and verification pulses Vvfy1 to Vvfy7. The program pulses Vpgm1 to Vpgm7 may be used to move a threshold voltage of the memory cell, and the verification pulses Vvfy1 to Vvfy7 may be used to verify the threshold voltage of the memory cell. For brevity, it will be assumed that the memory cell is changed from one of the states shown in FIGS. 12A and 12B into an adjacent state due to one of the pulses Vpgm1 to Vpgm7 shown in FIG. 13. For example, the memory cell may be changed from the erase state E into the first program state P1 with the application of the program pulse 'Vpgm1', and it may be verified whether the memory cell has the first program state P1 (or whether the memory cell is successfully changed into the first program state P1) with the application of the verification pulse 'Vvfy1'.

As described above with reference to FIGS. 12A and 12B, at a time point at which the first cell group includes the memory cell having the fourth program state P4, namely, at a time point 't11' in which the program pulse 'Vpgm4' and the verification pulse 'Vvfy4' have been applied in FIG. 13, one latch may be released. Similarly, at a time point at which the first cell group includes the memory cell having the sixth program state P6, namely, at a time point 't12' in which the program pulse 'Vpgm6' and the verification pulse 'Vvfy6' have been applied in FIG. 13, one more latch may be released.

Figure 14:
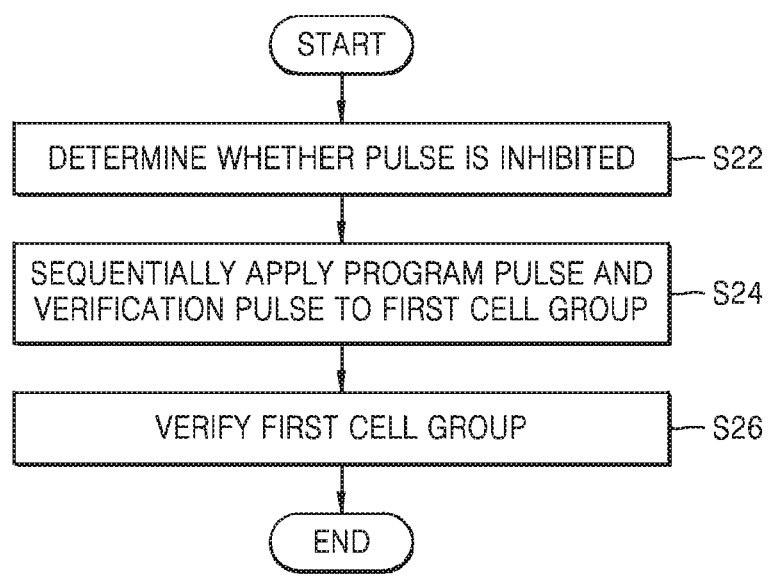
FIG. 14 is a flowchart of a method of applying pulses to a memory cell according to an exemplary embodiment.

FIG. 14 is a flowchart of a method of applying pulses to memory cells according to an exemplary embodiment. Specifically, FIG. 14 illustrates an example of operation S2 of FIG. 10, operation S10 of FIG. 11, operation S10a of FIG. 15A, or operation S10b of FIG. 15B.

In operation S22, there is an operation of determining whether a pulse is inhibited. That is, when a memory cell included in a first cell group reaches a final state corresponding to first data, subsequent application of a pulse to the memory cell may be inhibited. For example, in the first latch module 154_1' of FIG. 8, when the memory cell connected to the first latch module 154_1' through the first bit line BL1 reaches a final state, the bit line sensing unit 1545 may apply a signal to the first bit line BL1 so that a state of the memory cell may not be changed due to a subsequent pulse.

In operation S24, an operation of subsequently applying a program pulse and a verification pulse to the first cell group may be performed. For example, the write controller 122 of the memory device 100 of FIG. 2 may control the voltage generator 130 and the row decoder 140 to sequentially apply a pair of a program pulse and verification pulse to the first cell group in the graph of FIG. 13.

In operation S26, an operation of verifying the first cell group may be performed. Memory cells of the first cell group may be verified based on the verification pulse applied in operation S24. Thus, it may be determined whether the memory cells are changed into a state corresponding to the program pulse applied to the memory cells in operation S24.

Figure 15A:
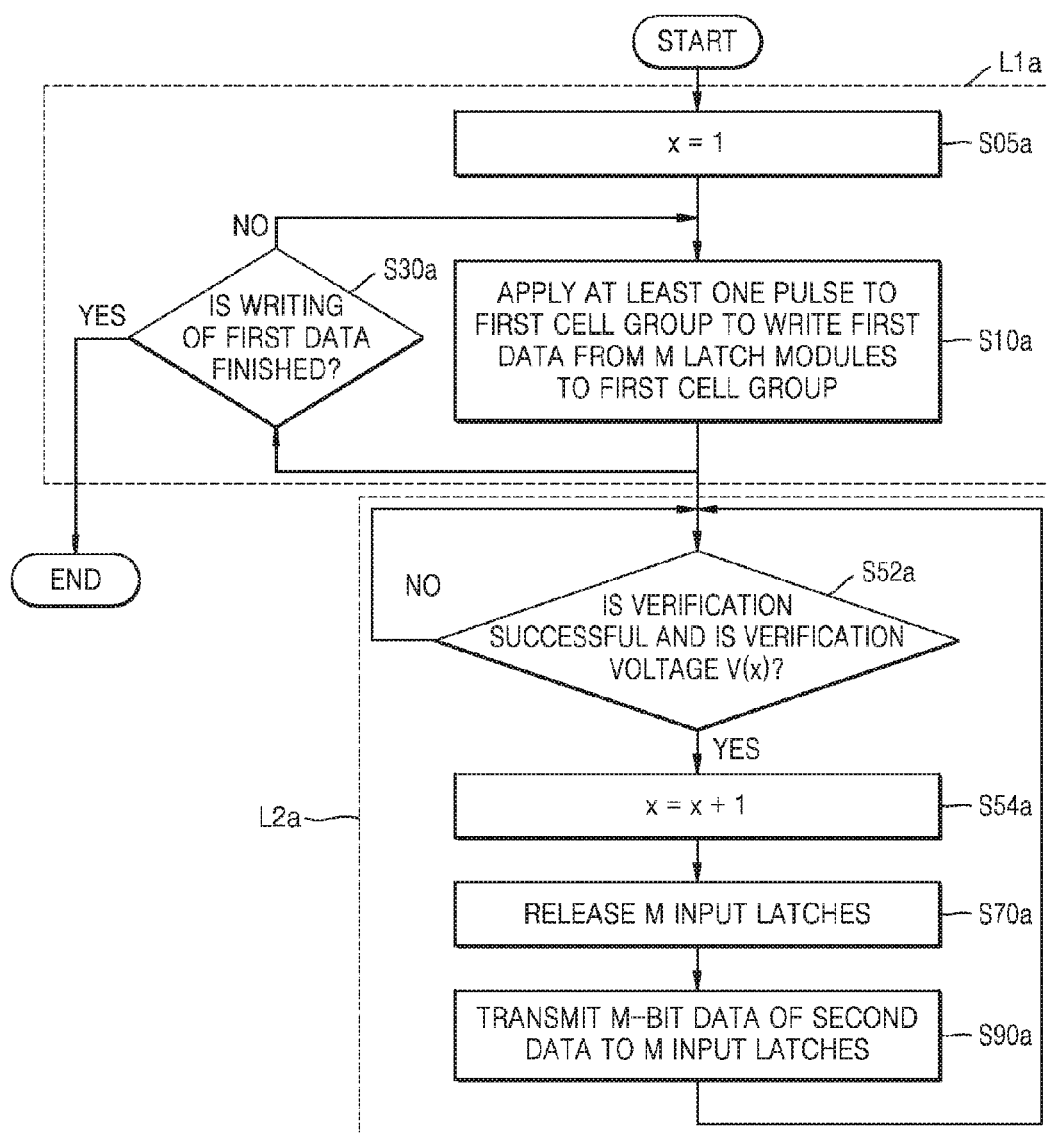
FIGS. 15A and 15B are flowcharts illustrating a method of writing data in a memory device including examples of operation S50 of FIG. 11, according to exemplary embodiments.
Figure 15B:
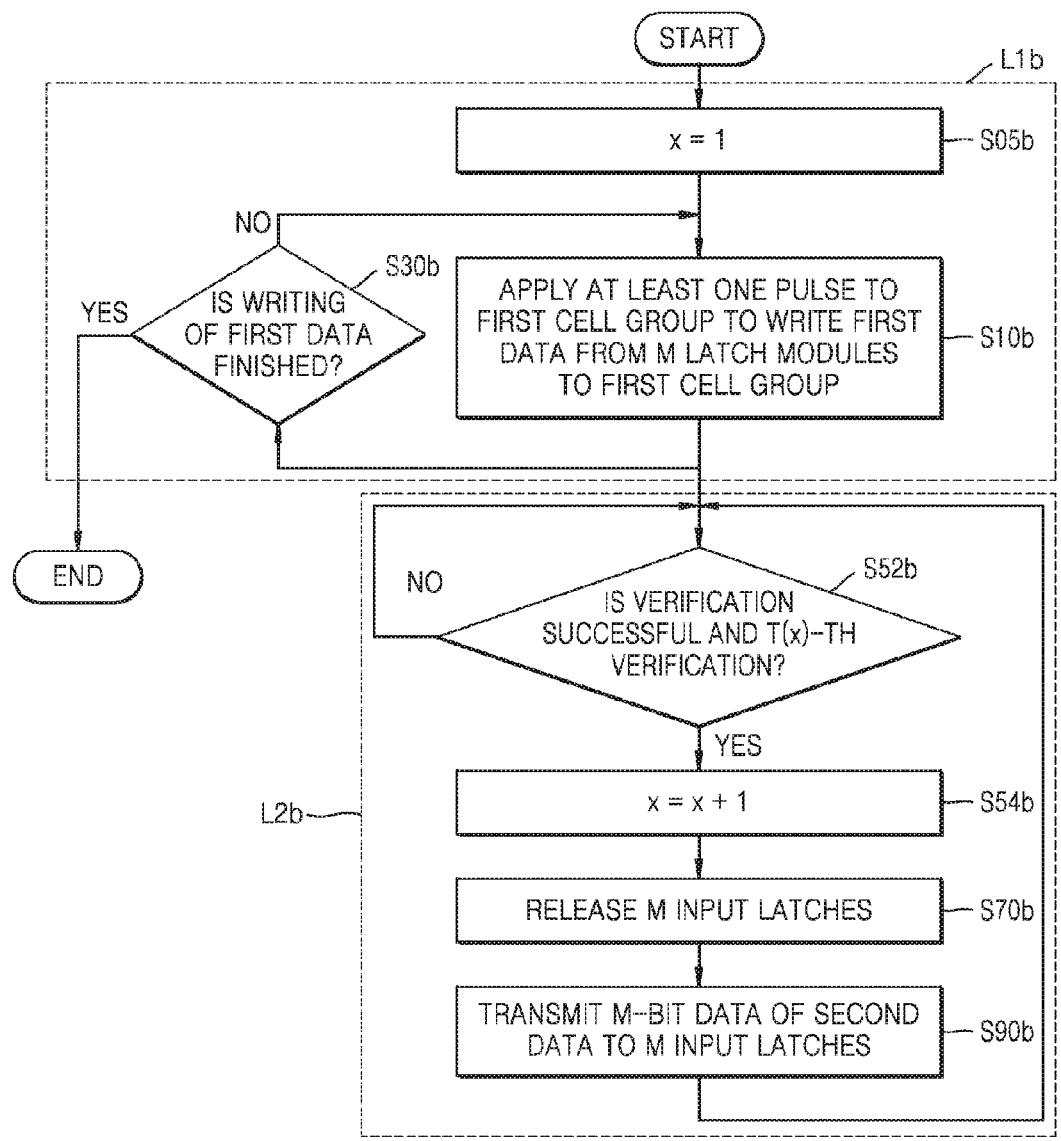

FIGS. 15A and 15B are flowcharts of a method of writing data in a memory device, which includes examples of operation S50, according to exemplary embodiments. Specifically, FIGS. 15A and 15B illustrate not only operations S52a, S54a, S52b, and S54b corresponding to operation S50 of FIG. 11 but also operations corresponding to other operations S10, S30, S70, and S90 of FIG. 11. Since operations S10a, S30a, S70a, S90a, S10b, S30b, S70b, and S90b of FIGS. 15A and 15B are similar to other operations S10, S30, S70, and S90 of FIG. 11, repeated descriptions thereof are omitted. Also, since first and second loops L1a, L2a, L1b, and L2b of FIGS. 15A and 15B are similar to the first and second loops L1 and L2 of FIG. 11, repeated descriptions thereof are omitted.

In the flowcharts of FIGS. 15A and 15B, a variable 'x', a function 'V(x)', and a function 'T(x)' are used to facilitate description of examples of operation S50 of FIG. 11. In other exemplary embodiments, the same operations as in the example of FIG. 15A or 15B may be performed in a different manner than shown in FIGS. 15A and 15B.

Referring to FIG. 15A, in operation S05a, a variable 'x' may be initialized to be 1. In operation S54a, the variable 'x' may have a value that is increased by as much as 1. The variable 'x' may have an integral value and be sequentially changed from 1 to 3, which is a bit number of data that may be stored in a triple-level cell, each time a latch is released.

In operation S52a, an operation of determining whether a verification operation of operation S10a is successful and whether a verification voltage used for the verification operation is 'V(x)' may be performed. That is, the write controller 122 of FIG. 2 may store at least one predetermined reference voltage and detect a time point at which a data write operation on a first cell group is performed, based on whether or not the verification voltage used in operation S10a is equal to the reference voltage. For example, in operation S10a, 'V(x)' may be a voltage 'V4' of FIG. 12A. If verification is successful in operation S10a and the verification voltage is 'V(X)' (i.e., 'V4'), it may be determined that the data write operation of the first cell group is proceeded up to the fourth program state P4.

In operation S52a, when the verification operation using 'V(x)' as the verification voltage is determined as being successful, a reference voltage to be compared to a verification voltage may be changed into the next reference voltage of predetermined reference voltages in operation S54a, and m input latches may be released in operation S70a.

Referring to FIG. 15B, operations S05b and S54b may be similar to operations S05a and S54a of FIG. 15A. Repeated descriptions of operations S05b and S54b are omitted.

In operation S52b, an operation of determining whether a verification operation of operation S10b is successful and whether the successful verification operation is a 'T(x)'-th verification operation may be performed. That is, the write controller 122 of FIG. 2 may store at least one predetermined positive integer and detect a time point at which a data write operation is performed on the first cell group, depending on whether the successful verification operation of operation S10b is a k-th verification operation. Here, k is one of the at least one predetermined positive integer. For example, in operation S10b, k may be 4, and the distributions depicted by the graph of FIG. 12A may occur when a fourth verification operation is successful. Thus, it may be determined that the data write operation of the first cell group is proceeded up to the fourth program state P4.

Similar to operation S52a, in operation S52b, when it is determined that the successful verification operation of operation S10b is the k-th verification operation, k may be changed into the next integer of the at least one predetermined positive integer to be used, and m input latches may be released in operation S70b.

Figure 16:
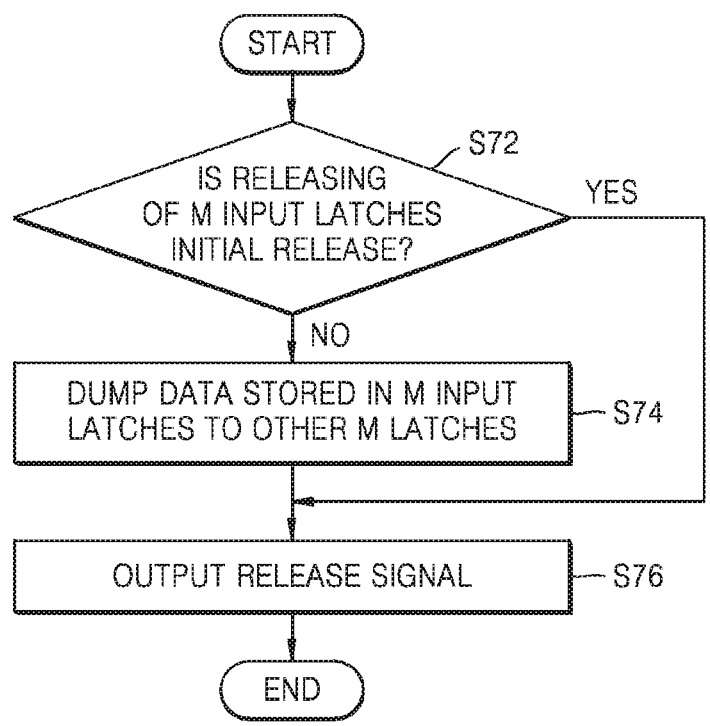
FIG. 16 is a flowchart of an example of operation S70 of FIG. 11, according to an exemplary embodiment.

FIG. 16 is a flowchart of an example of operation S70 of FIG. 11, according to an exemplary embodiment. Referring to FIG. 16, operation S70 of FIG. 11 may include operations S72, S74, and S76.

Referring to FIGS. 8 and 16, data may be input to an input latch 1543 included in a first latch module 154_1' or data may be output from the input latch 1543. When new data (i.e., 1-bit data) is written to the first latch module 154_1', the new data must be transmitted to the input latch 1543. Thus, when data stored in the input latch 1543 is useful, the data stored in the input latch 1543 may be dumped to another latch and the new data may be overwritten to the input latch 1543.

In operation S72, an operation of determining whether the releasing of the m input latches is an initial release may be performed. That is, after an operation of writing first data to the first cell group is started, an operation of determining whether the releasing of the m input latches is the initial release may be performed. When the releasing of the m input latches is the initial release, new data may be overwritten to the m input latches. This is because m-bit data stored in the m input latches are not useful any longer during the operation of writing the first data.

In operation S74, when the releasing of the m input latches is not the initial release in operation S72, an operation of dumping data stored in the m input latches to other m latches may be performed. Specifically, when the releasing of the m input latches is not the initial release after the operation of writing the first data to the first cell group is started, since the m input latches store m-bit data included in second data to be written to a second cell group, the m-bit data stored in the m input latches may be dumped to other latches included in each of the latch modules 154_1 to 154_m. For example, referring to FIGS. 2 and 7, to release the m input latches, the write controller 122 of FIG. 2 may generate a page buffer control signal CTRL_RB so that the latch module controller 152 of FIG. 7 may dump data stored in the m input latches to other m input latches.

In operation S76, an operation of outputting a release signal may be performed. Referring to FIG. 2, the write controller 122 may generate a page buffer control signal CTRL_PB to release m input latches, and output a release signal to the outside of the memory device 100 (e.g., the memory controller 200 of FIG. 1). For example, the write controller 122 may change a state (e.g., pull-up state or pull-down state) of an input pin to which a control signal CTRL or a command CMD is transmitted, and output a release signal to the outside of the memory device 100. The memory controller 200 of FIG. 1 may transit m-bit data, which is part of second data, to the memory device 100 in response to the release signal received from the memory device 100. In the memory cell array 110 including triple-level cells, the m input latches are released three times during the writing of the first data to the first cell group (i.e., for a time duration 'tPROG'), the entire second data to be written to the second cell group including m memory cells may be stored in the page buffer 150 before the writing of the first data is finished.

Figure 17:
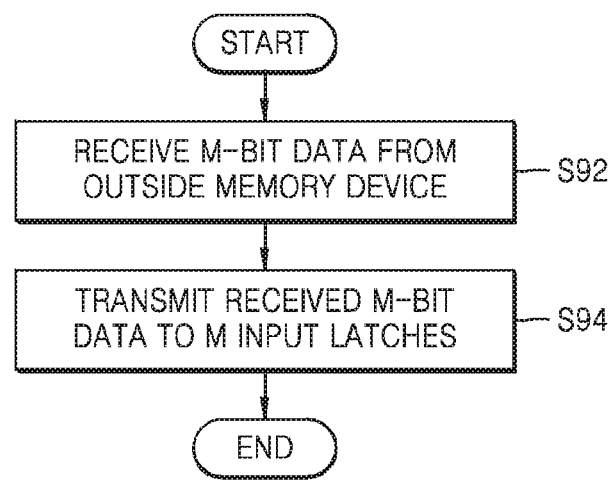
FIG. 17 is a flowchart of an example of operation S90 of FIG. 11, according to an exemplary embodiment.

FIG. 17 is a flowchart of an example of operation S90 of FIG. 11, according to an exemplary embodiment. Specifically, FIG. 17 is a flowchart of a method of transmitting m-bit data to the page buffer 150 of FIG. 2. Hereinafter, the flowchart of FIG. 17 will be described in detail with reference to FIGS. 2 and 17.

In operation S92, an operation of receiving m-bit data from the outside of the memory device 100 may be performed. For example, the write controller 122 may generate an I/O control signal CTRL_I/O such that the data I/O circuit 170 externally receives the m-bit data.

In operation S94, an operation of transmitting the received m-bit data to m input latches may be performed. For example, the write controller 122 may generate an I/O control signal CTRL_I/O and a column address Y-ADDR so that the m-bit data may be transmitted from the data I/O circuit 170 through the column decoder 160. Also, the write controller 122 may generate a page buffer control signal CTRL_PB so that the m-bit data transmitted to the page buffer 150 may be stored in the m input latches of the page buffer 150.

Figure 18:
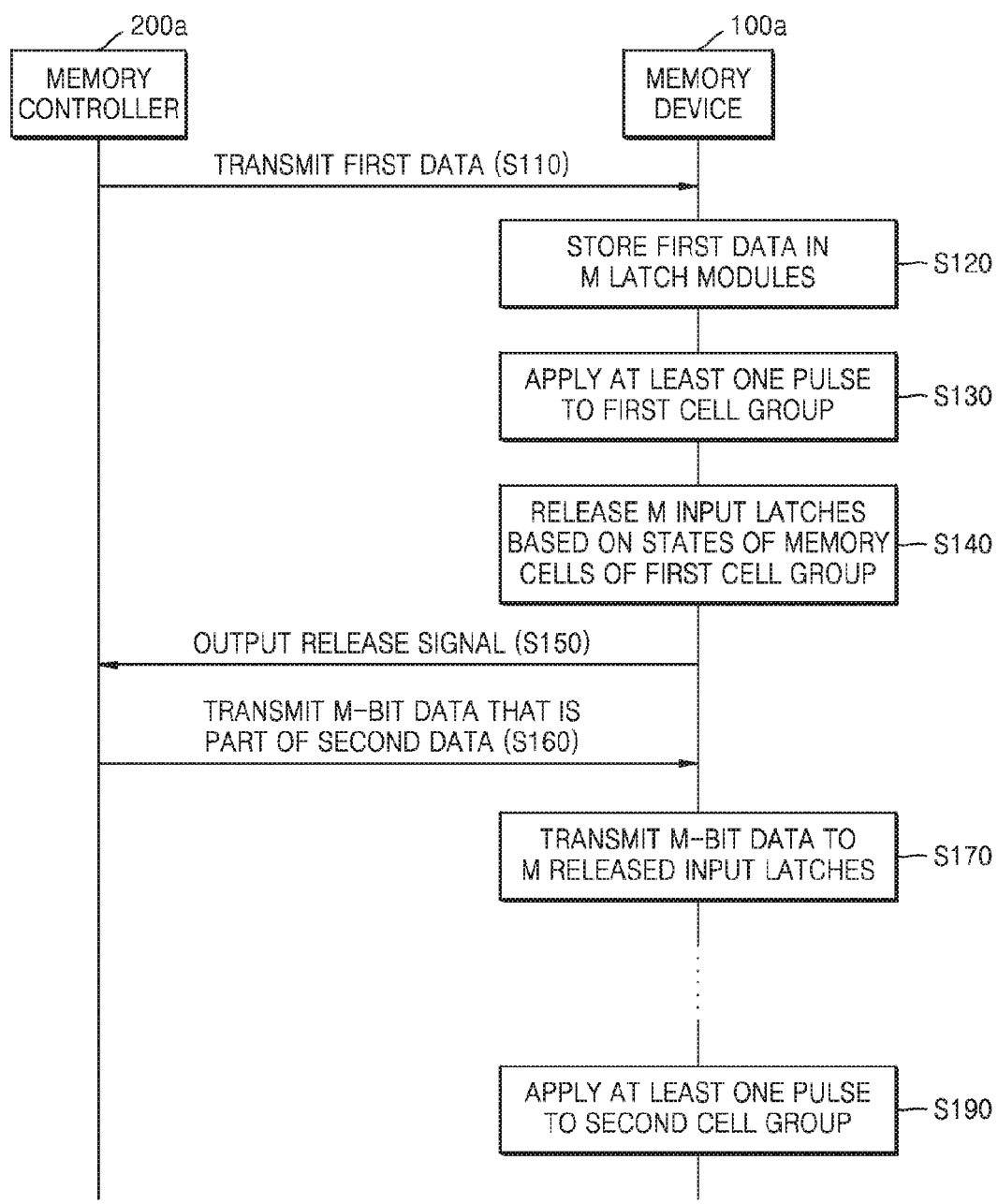
FIG. 18 is a flowchart of a method of operating a memory system according to an exemplary embodiment.

FIG. 18 is a flowchart of a method of operating a memory system according to an exemplary embodiment. As described above with reference to FIG. 1, the memory system may include a memory controller 200a and a memory device 100a.

Referring to FIG. 18, in operation 5110, the memory controller 200a may transmit first data. The memory controller 200a may further transmit not only first data but also a write command and a write address corresponding to a first cell group.

In operation S120, the memory device 100a may store the received first data in m latch modules. Next, in operation S130, the memory device 100a may sequentially apply at least one pulse (e.g., a program pulse and a verification pulse) to the first cell group to write the first data in the first cell group. States of memory cells included in the first cell group may be changed in response to the applied pulse. In operation S140, the m input latches may be released based on the states of the memory cells of the first cell group. Next, in operation S150, the memory device 110a may output a release signal.

In operation S160, the memory controller 200a may transmit m-bit data, which is part of second data. That is, the memory controller 200a may transmit the m-bit data, which is part of second data to be stored sequentially after the first data, in the memory device 100a in response to a release signal output by the memory device 100a. In operation S170, the memory device 100a may transmit the m-bit data to the m released input latches.

Although not shown, operations S140 to S170 may be performed at least twice during the writing of the first data to the first cell group. For example, when memory cells included in the memory device 100a are capable of storing n-bit data, operations S140 to S170 may be performed at least n times during the writing of the first data in the first cell group. Although not shown, operation S130 may be performed until the writing of the first data is finished, independent of operations S140 to S170. When the writing of the first data is finished, in operation S190, the memory device 110a may apply at least one pulse to a second cell group to write the second data in the second cell group.

Figure 19:
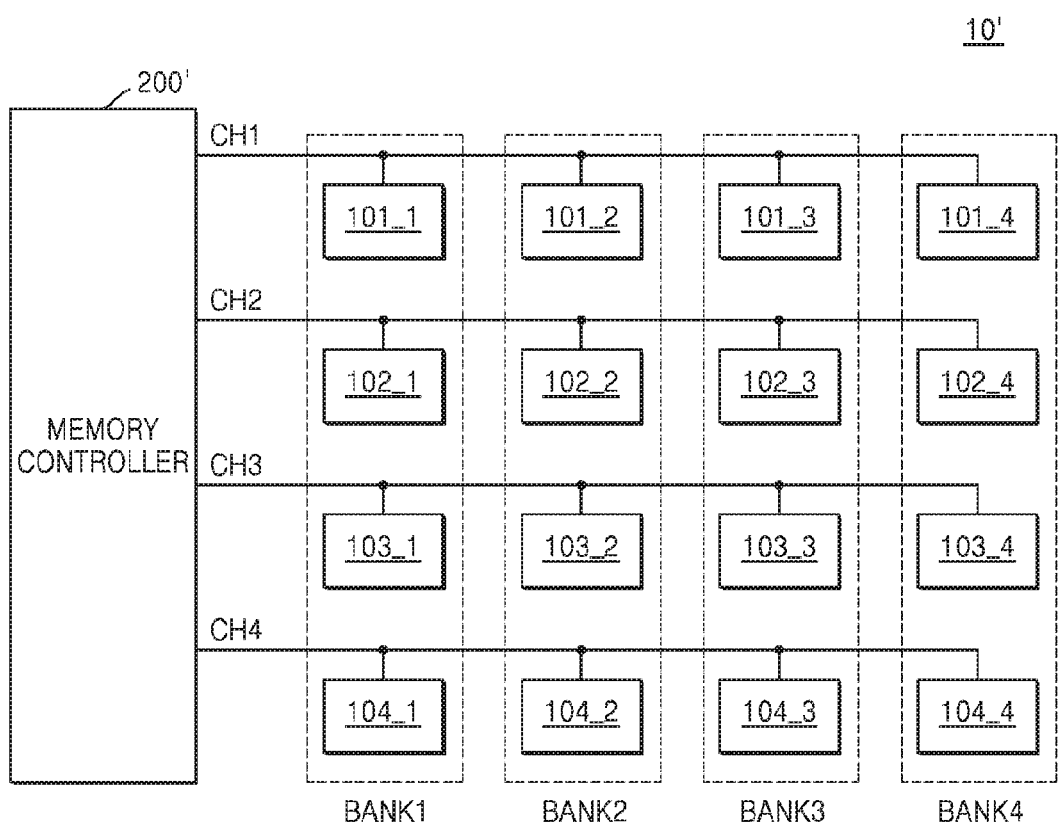
FIG. 19 is a block diagram of a memory system according to an exemplary embodiment.
Figure 20A:
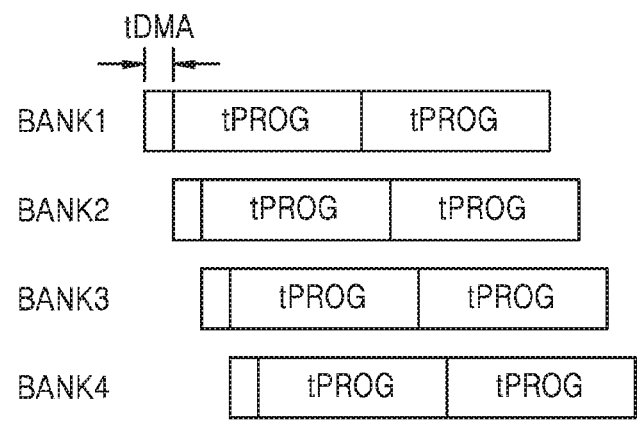
FIGS. 20A and 20B are timing diagrams for explaining relationships between a time duration tDMA of FIG. 9 and the number of banks.
Figure 20B:
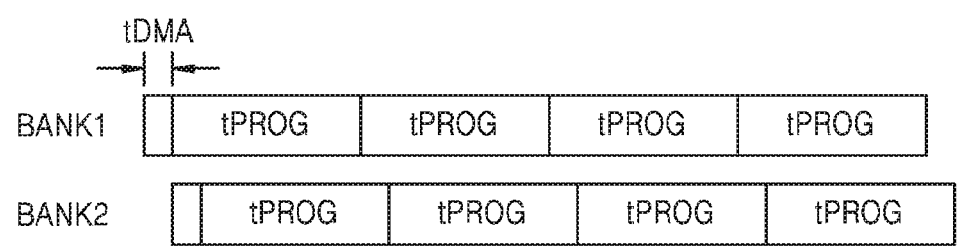

FIG. 19 is a block diagram of a memory system 10' according to an exemplary embodiment. FIGS. 20A and 20B are timing diagrams for explaining relationships between a time duration tDMA of FIG. 9 and the number of banks. Referring to FIG. 19, the memory system 10' may include a memory controller 200' and a plurality of memory devices 101_1 to 104_4.

Referring to FIG. 19, the memory system 10' may include a structure in which a plurality of memory devices share a channel connected to the memory controller 200'. For example, memory devices 101_1 to 101_4 may share a first channel CH1 and communicate with the memory controller 200' via the first channel CH1. In this case, if the first channel CH1 is not in a busy state, one of the memory devices 101_1 to 101_4 may communicate with the memory controller 200'.

In the memory system 10', memory devices connected to the memory controller 200' through different channels may communicate with the memory controller 200' in parallel. Referring to FIG. 19, four memory devices 101_1 to 104_1 respectively connected to four channels CH1 to CH4 may be defined by a first bank BANK1, and each of second to fourth banks BANK2 to BANK4 may be defined in a similar manner. Memory devices included in one bank may simultaneously communicate with the memory controller 200'.

Memory devices configured to share one channel, for example, the memory devices 101_1 to 101_4 configured to share the first channel CH1, may be prohibited from communicating with the memory controller 200' while another memory device is communicating with the memory controller 200' by using a channel. For example, while the memory controller 200' is transmitting data to the memory device 101_1 (i.e., for the time duration tDMA), the memory devices 101_2 to 101_4 may not receive data from the memory controller 200'.

FIG. 20A illustrates an operation of sequentially storing data when a plurality of memory devices constitute four banks, such as the four memory devices 101_1 to 101_4 connected to the first channel CH1. FIG. 20B illustrates an operation of sequentially storing data when a plurality of memory devices constitute two banks, such as only two memory devices 101_1 and 101_2 connected to the first channel CH1. In examples shown in FIGS. 20A and 20B, data may be transmitted eight times from the memory controller 200' through the first channel CH1 to each of the memory devices 101_1 to 101_4 or the memory devices 101_1 and 101_2.

Referring to FIG. 20A, a data storage method of a memory device according to the present exemplary embodiment may reduce a time taken to finish the storing of data by a time duration 'tDMA' relative to a typical data storage method. That is, according to the typical data storage method, the storing of data may be ended in the fourth bank BANK4 at a time point that trails a data storage end time point shown in FIG. 20A by the time duration 'tDMA'.

Referring to FIG. 20B, the data storage method of the memory device according to the present exemplary embodiment may reduce a time taken to finish the writing of data by a time duration '3tDMA' relative to a typical data writing method. That is, according to the typical data writing method, the writing of data may be ended in the second bank BANK2 at a time point that trails a data writing end time point shown in FIG. 20B by the time duration '3tDMA'.

When the memory system 10' includes a memory device including VNAND flash memory cells as shown in FIGS. 3 and 4, as the integration density of memory cells included in the memory device increases, the number of banks may decrease. Also, as the number of the banks decreases, an overhead due to a time (i.e., tDMA) taken to transmit data from the memory controller 200' to the memory device may increase. In other words, interleaving between semiconductor memory devices connected to the same channel may be reduced. Accordingly, a method of operating a memory device according to an exemplary embodiment may reduce a time taken to store sequential data and lessen the influence of the overhead.

Figure 21:
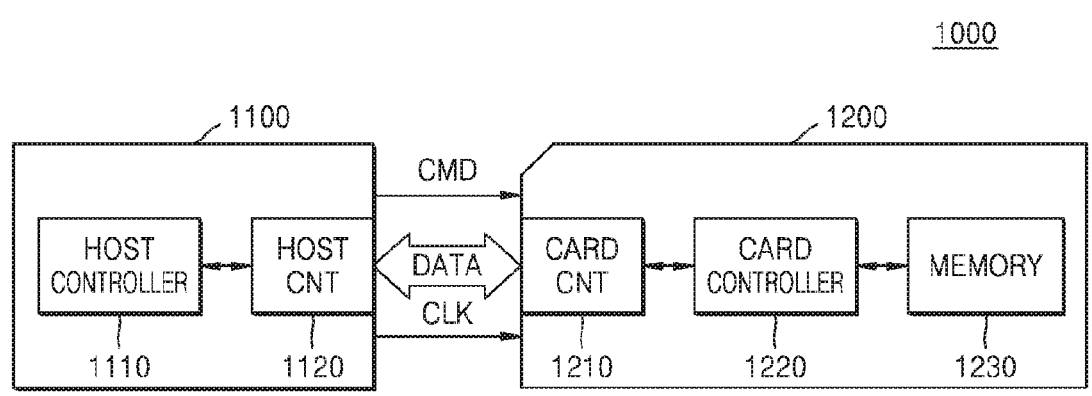
FIG. 21 is a block diagram of an example of applying a memory system according to an exemplary embodiment to a memory card system.

FIG. 21 is a block diagram of an example of applying a memory system according to an exemplary embodiment to a memory card system 1000. Referring to FIG. 21, the memory card system 1000 may include a host 1100 and a memory card 1200.

The host 1100 may include a host controller 1110 and a host connector 1120. The memory card 1200 may include a card connector 1210, a card controller 1220, and a memory device 1230. In this case, the memory card 1200 may be embodied by using the exemplary embodiments shown in FIGS. 1 to 20. In some exemplary embodiments, a time taken to store sequential data to the memory device 1230 may be reduced so that a time taken for the memory card 1200 to respond to a write request of the host 1100 may be reduced.

The host 1100 may store data in the memory card 1200 or read the data stored in the memory card 1200. The host controller 1110 may transmit a command CMD, a clock signal CLK generated by a clock generator (not shown) of the host 1100, and data DATA via the host connector 1120 to the memory card 1200.

The card controller 1220 may store data in the memory device 1230 in synchronization with the clock signal generated by a clock generator (not shown) included in the card controller 1220, in response to a command received through the card connector 1210. The memory device 1230 may store data transmitted by the host 1100.

The memory card 1200 may be embodied by a compact flash card (CFC), a microdrive, a smart media card (SMC), a multimedia card (MMC), a secure digital card (SDC), a memory stick, and/or a USB flash memory driver.

Figure 22:
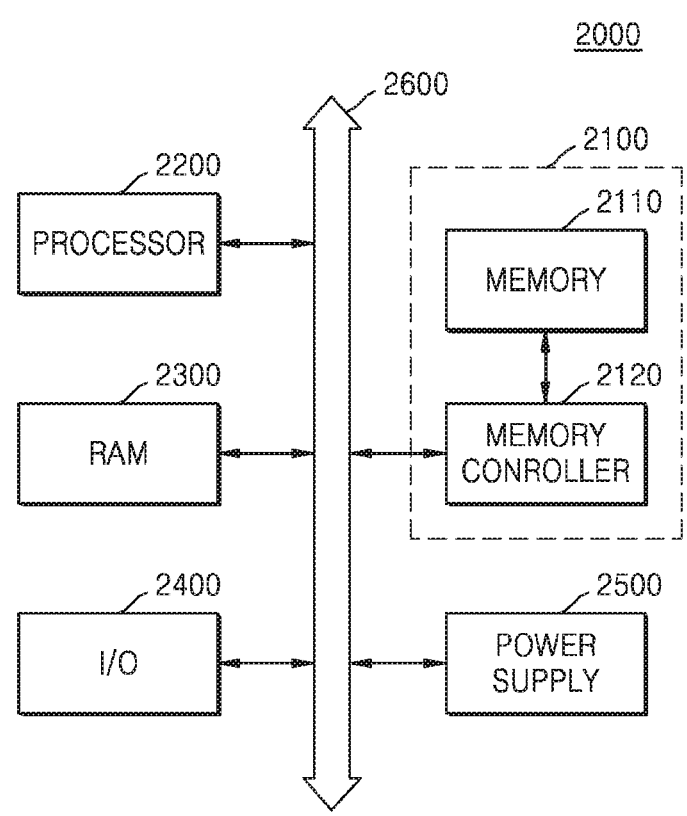
FIG. 22 is a block diagram of a computing system including a memory system according to an exemplary embodiment.

FIG. 22 is a block diagram of a computing system 2000 including a memory system 2100 according to an exemplary embodiment. Referring to FIG. 22, the computing system 2000 may include a memory system 2100, a processor 2200, a RAM 2300, an I/O device 2400, and a power supply 2500. Although not shown in FIG. 22, the computing system 2000 may communicate with a video card, a sound card, a memory card, and a USB device or further include ports capable of communicating with other electronic devices. The computing system 2000 may be embodied by a personal computer (PC) or a portable electronic device, such as a laptop computer, a portable phone, a personal digital assistant (PDA), and a camera.

The processor 2200 may make calculations or perform tasks. In some exemplary embodiments, the processor 2200 may be a microprocessor (MP) or a central processing unit (CPU). The processor 2200 may communicate with the RAM 2300, the I/O device 2400, and the memory system 2100 through a bus 2600, such as an address bus, a control bus, and a data bus. In this case, the memory system 2100 may be embodied by using the embodiments shown in FIGS. 1 to 21. In some exemplary embodiments, a time taken to store sequential data to the memory device 2110 may be reduced so that a time taken for the memory system 2100 to respond to a write request received from the processor 2220 may be reduced. The processor 2200 may be connected to an expansion bus, such as a peripheral component interconnect (PCI) bus.

The RAM 2300 may store data required for an operation of the computing system 2000. For example, the RAM 2300 may be dynamic RAM (DRAM), mobile DRAM, static RAM (SRAM), phase-change RAM (PRAM), ferroelectric RAM (FRAM), resistive RAM (RRAM), and/or magnetic RAM (MRAM).

The I/O device 2400 may include an input unit, such as a keyboard, a keypad, or a mouse, and an output unit, such as a printer or a display. The power supply 2500 may supply an operating voltage required for an operation of the computing system 2000.

Figure 23:
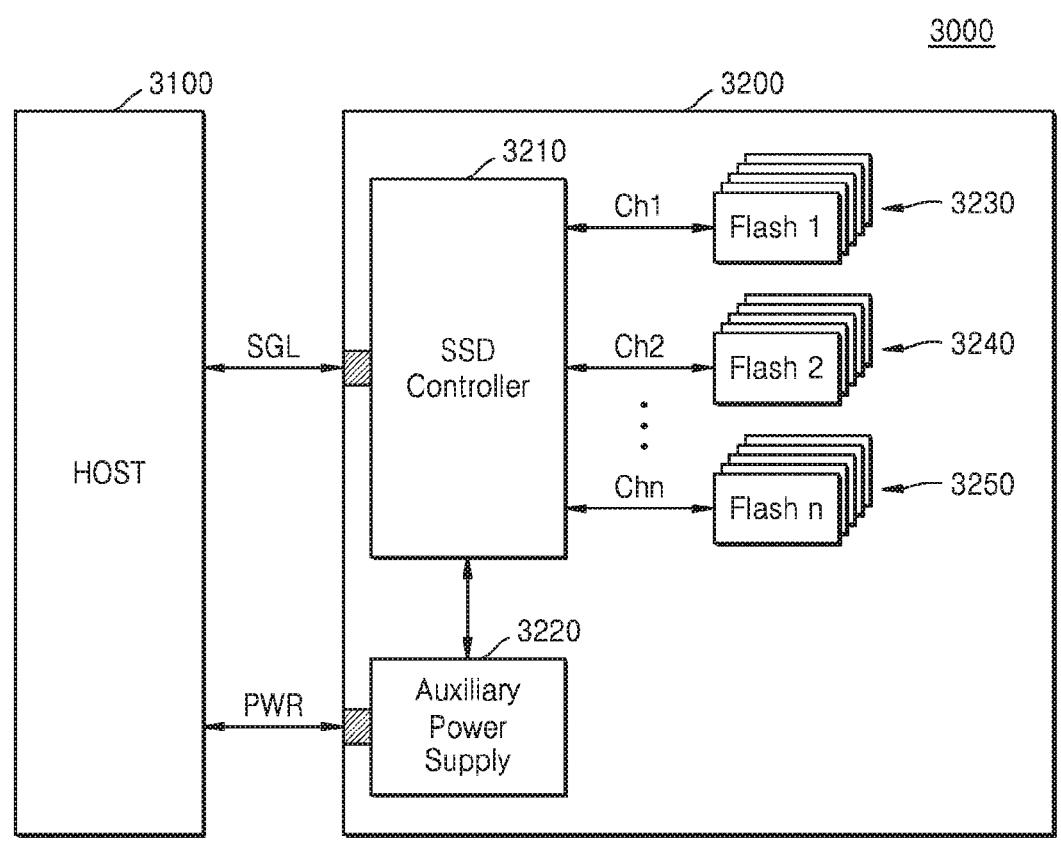
FIG. 23 is a block diagram of an example of applying a memory system according to an exemplary embodiment to a solid-state drive (SSD) system.

FIG. 23 is a block diagram of an example of applying a memory system according to an exemplary embodiment to a solid-state drive (SSD) system 3000. Referring to FIG. 23, the SSD system 3000 may include a host 3100 and an SSD 3200. The SSD 3200 may exchange signals with the host 3100 through a signal connector, and receive power through a power connector. The SSD 3200 may include an SSD controller 3210, an auxiliary power supply 3220, and a plurality of memory devices (e.g., memory devices 3230, 3240, and 3250). The memory devices 3230, 3240, and 3250 may be VNAND flash memory devices. In this case, the SSD 3200 may be embodied by using the exemplary embodiments shown in FIGS. 1 to 22.

While the inventive concept has been particularly shown and described with reference to exemplary embodiments thereof, it will be understood that various changes in form and details may be made therein without departing from the spirit and scope of the following claims.

What is claimed is:

1. A method of operating a non-volatile memory device including a memory cell array including a plurality of memory cells vertically stacked on a substrate and configured to respectively store n-bit data, and a page buffer configured to write data in parallel in m memory cells of the plurality of memory cells, wherein the page buffer comprises m latch modules, each of which comprises n latches including an input latch, and each of m and n is an integer equal to or greater than 2, the method of operating the non-volatile memory device comprising:
applying at least one pulse to a first cell group of the memory cell array to write first data stored in the m latch modules to the first cell group;
releasing m input latches of the m latch modules based on states of memory cells of the first cell group, which are changed according to the at least one pulse; and
transmitting second data to be written to a second cell group of the memory cell array in units of m-bit data to the m input latches;
wherein releasing of the m input latches comprises dumping data stored in the input latch of each of the m latch modules to another latch of the n latches.

2. The method of claim 1, wherein releasing of the m input latches and transmitting of the m-bit data of the second data are performed n times during writing of the first data to the first cell group.

3. The method of claim 2, wherein applying of the at least one pulse to the first cell group is performed at least n times until the writing of the first data is finished; and further comprising applying at least one pulse to the second cell group to write the second data stored in the m latch modules to the second cell group, after writing of the first data is finished.

4. The method of claim 3, wherein when applying of the at least one pulse to the first cell group is performed first, the at least one pulse is applied to the first cell group based on data stored in at least two of the n latches of each of the m latch modules.

5. The method of claim 3, further comprising inhibiting subsequent application of a pulse to a memory cell, which has reached a state corresponding to the first data due to the at least one pulse, from among the memory cells of the first cell group, during performing the at least n times the applying of the at least one pulse to the first cell group.

6. The method of claim 1, wherein releasing of the m input latches further comprises outputting a release signal outside of the non-volatile memory device.

7. The method of claim 1, wherein transmitting of the m-bit data of the second data comprises:
receiving m-bit data as part of the second data from outside the non-volatile memory device; and
transmitting the received m-bit data to the m released input latches.

8. The method of claim 1, wherein dumping of the data stored in the input latch is performed during the transmitting of the m-bit data of the second data after first m-bit data of the second data is transmitted.

9. The method of claim 1, wherein applying of the at least one pulse to the first cell group comprises applying at least one program pulse and at least one verification pulse to the first cell group; and wherein releasing of the m input latches is performed based on a verification result obtained due to the at least one verification pulse.

10. A method of operating a memory system comprising a non-volatile memory device and a memory controller configured to control the non-volatile memory device, wherein the non-volatile memory device comprises a memory cell array including a plurality of memory cells vertically stacked on a substrate, each memory cell configured to store n-bit data, and a page buffer configured to write data in parallel to m memory cells of the plurality of memory cells, and wherein the page buffer comprises m latch modules, each latch module comprising n latches including an input latch, and wherein each of m and n is an integer equal to or greater than 2, the method comprising:
applying at least one pulse to a first cell group of the memory cell array to write first data stored in the m latch modules to the first cell group in the non-volatile memory device;
releasing m input latches of the m latch modules based on states of memory cells of the first cell group, which are changed according to the at least one pulse in the non-volatile memory device;
outputting a release signal from the non-volatile memory device to the memory controller; and
transmitting m-bit data of second data to be written to a second cell group of the memory cell array to the non-volatile memory device in response to the release signal in the memory controller;
wherein releasing of the m input latches and transmitting of the m-bit data of the second data are performed at least twice during writing of the first data in the first cell group.

11. The method of claim 10, further comprising transmitting the received m-bit data of the second data to the released m input latches in the non-volatile memory device; wherein releasing of the m input latches comprises dumping the data stored in the input latch to another latch of the n latches in each of the m latch modules.

12. The method of claim 11, wherein dumping of the data stored in the input latch is performed during transmitting of the m-bit data of the second data after first m-bit data of the second data is transmitted.

13. The method of claim 10, wherein releasing of the m latches and transmitting of the m-bit data of the second data are performed n times during writing of the first data to the first cell group.

14. The method of claim 13, wherein applying of the at least one pulse to the first cell group is performed at least n times until the writing of the first data is finished; and further comprising applying at least one pulse to the second cell group in the non-volatile memory device to write the second data stored in the m latch modules to the second cell group, after writing of the first data is finished.

15. The method of claim 14, wherein when applying of the at least one pulse to the first cell group is performed first, the at least one pulse is applied to the first cell group based on data stored in at least two of the n latches of each of the m latch modules.

16. A method of operating a memory system comprising a non-volatile memory device that includes a plurality of memory cells and a page buffer configured to write data to the plurality of memory cells, and wherein the page buffer comprises latch modules each comprising latches including an input latch, the method comprising:
applying at least one pulse to a first cell group of the plurality of memory cells to write first data stored in the latch modules to the first cell group in the non-volatile memory device;
releasing input latches of the latch modules based on states of memory cells of the first cell group which are changed according to the at least one pulse;
outputting a release signal from the non-volatile memory device; and
transmitting second data to be written to a second cell group of the plurality of memory cells to the non-volatile memory device in response to the release signal;
wherein releasing of the input latches and transmitting of the second data are performed at least twice during writing of the first data in the first cell group.

17. The method of claim 16, further comprising transmitting the received second data to the released input latches in the non-volatile memory device; wherein releasing of the input latches comprises dumping the data stored in the input latch to another latch in each of the latch modules.

18. The method of claim 17, wherein dumping of the data stored in the input latch is performed during transmitting of the second data.

19. The method of claim 16, wherein releasing of the latches and transmitting of the second data are performed multiple times during writing of the first data to the first cell group.

20. The method of claim 19, wherein applying of the at least one pulse to the first cell group is performed multiple times until writing of the first data is finished; and further comprising applying at least one pulse to the second cell group in the non-volatile memory device to write the second data stored in the latch modules to the second cell group, after writing of the first data is finished.

* * * * *